US012787385B2

(12) United States Patent
Takamura et al.

(10) Patent No.: US 12,787,385 B2
(45) Date of Patent: Nov. 3, 2026

(54) SILICON CARBIDE SEMICONDUCTOR SUBSTRATE AND SEMICONDUCTOR DEVICE

(71) Applicant: ROHM CO., LTD., Kyoto (JP)

(72) Inventors: Makoto Takamura, Kyoto (JP); Takuji Maekawa, Kyoto (JP); Mitsuru Morimoto, Kyoto (JP); Noriyuki Masago, Kyoto (JP); Takayasu Oka, Kyoto (JP)

(73) Assignee: ROHM CO. , LTD., Kyoto (JP)

( * ) Notice: Subject to any disclaimer, the term of this patent is extended or adjusted under 35 U.S.C. 154(b) by 481 days.

(21) Appl. No.: 18/356,223

(22) Filed: Jul. 21, 2023

(65) Prior Publication Data

US 2023/0369400 A1 Nov. 16, 2023

Related U.S. Application Data

(63) Continuation of application No. PCT/JP2021/040756, filed on Nov. 5, 2021.

(30) Foreign Application Priority Data

Jan. 25, 2021 (JP) ................................ 2021-009889

(51) Int. Cl.

*H10D 62/10* (2025.01)
*H10D 8/01* (2025.01)

(Continued)

(52) U.S. Cl.

CPC ........... *H10D 62/124* (2025.01); *H10D 8/051* (2025.01); *H10D 8/60* (2025.01); *H10D 12/031* (2025.01);

(Continued)

(58) Field of Classification Search

CPC ............... H10D 62/124; H10D 62/405; H10D 8/051; H10D 8/60; H10D 30/66; H10D 62/8325;

(Continued)

(56) References Cited

U.S. PATENT DOCUMENTS

2012/0181550 A1* 7/2012 Fujibayashi ....... H10D 62/8503 257/77
2014/0264374 A1* 9/2014 Hecht ................. H10P 14/3408 257/77

(Continued)

FOREIGN PATENT DOCUMENTS

JP 2017-055022 A 3/2017
JP 2017-057102 A 3/2017

(Continued)

OTHER PUBLICATIONS

Official Action issued on Dec. 2, 2025, in the counterpart Japanese patent application No. 2022-576989 (8 pages; with English translation).

(Continued)

*Primary Examiner* — Eliseo Ramos Feliciano
*Assistant Examiner* — Timothy Edward Duren
(74) *Attorney, Agent, or Firm* — XSENSUS LLP

(57) ABSTRACT

A semiconductor substrate (1) according to an embodiment includes: a hexagonal SiC single crystal layer (13I); an SiC epitaxial growth layer (12E) disposed on an Si plane of an SiC single crystal layer (13I); and an SiC polycrystalline growth layer (18PC) disposed on a C plane opposite to the Si plane of the SiC single crystal layer (13I). The SiC single crystal layer (13I) includes a single crystal SiC thin layer (10HE) obtained by weakening the hydrogen ion implantation layer (10HI), and a phosphorus ion implantation layer (10PI). The phosphorus ion implantation layer (10PI) is disposed between the single crystal SiC thin layer (10HE) and the SiC polycrystalline growth layer (18PC). Conse- (Continued)

quently, the present disclosure provides a low-cost and high-quality semiconductor substrate and a fabrication method thereof.

8 Claims, 13 Drawing Sheets

(51) Int. Cl.

| | |
|---|---|
| ***H10D 8/60*** | (2025.01) |
| ***H10D 12/01*** | (2025.01) |
| ***H10D 30/66*** | (2025.01) |
| ***H10D 62/40*** | (2025.01) |
| ***H10D 62/832*** | (2025.01) |
| ***H10P 14/20*** | (2026.01) |

(52) U.S. Cl.
CPC ........... *H10D 30/66* (2025.01); *H10D 30/668* (2025.01); *H10D 62/405* (2025.01); *H10D 62/8325* (2025.01); *H10P 14/2904* (2026.01); *H10P 14/3208* (2026.01); *H10P 14/3256* (2026.01); *H10P 14/3408* (2026.01); *H10P 14/3456* (2026.01); *H10P 14/36* (2026.01)

(58) Field of Classification Search
CPC .... H10D 30/668; H10D 12/031; H10P 14/36; H10P 14/3456; H10P 14/2904; H10P 14/3408; H10P 14/3208; H10P 14/3256
See application file for complete search history.

(56) References Cited

U.S. PATENT DOCUMENTS

| | | | | |
|---|---|---|---|---|
| 2015/0034970 | A1 | 2/2015 | Aketa et al. | |
| 2016/0087036 | A1 * | 3/2016 | Shimizu ............. | H10D 30/0291 257/77 |

FOREIGN PATENT DOCUMENTS

| | | | | |
|---|---|---|---|---|
| JP | 2017-059626 | A | 3/2017 | |
| JP | 6206786 | B2 | 10/2017 | |
| JP | 2018-107303 | A | 7/2018 | |
| JP | 6544166 | B2 | 7/2019 | |
| JP | 6582779 | B2 | 10/2019 | |
| JP | 2019-210161 | A | 12/2019 | |
| WO | WO-2012157679 | A1 * | 11/2012 | ........... H01L 21/046 |

OTHER PUBLICATIONS

Official Action issued on Jul. 1, 2025, in counterpart Japanese patent application No. JP 2022-576989 (7 pages; with English machine translation).

International Search Report and Written Opinion mailed on Dec. 28, 2021, received for PCT Application PCT/ JP2021/040756, filed on Nov. 5, 2021, 13 pages including English Translation.

* cited by examiner

SILICON CARBIDE SEMICONDUCTOR SUBSTRATE AND SEMICONDUCTOR DEVICE

CROSS-REFERENCE TO RELATED APPLICATIONS

This is a continuation application (CA) of PCT Application No. PCT/JP2021/040756, filed on Nov. 5, 2021, which claims priority to Japanese Patent Application No. 2021-009889, filed on Jan. 25, 2021, the entire contents of each of which are incorporated herein by reference.

FIELD

The embodiments described herein relate to a semiconductor substrate and a semiconductor device.

BACKGROUND

In recent years, since Silicon Carbide (SiC) semiconductors have wider bandgap energy and has high breakdown voltage performance at high electric field than silicon semiconductors or GaAs semiconductors, much attention has been given to such SiC semiconductors capable of realizing high breakdown voltage, high current use, low on resistance, high degree of efficiency, power consumption reduction, high speed switching, and the like.

As a method of forming an SiC wafer, for example, there are a method of forming an SiC epitaxial growth layer by a Chemical Vapor Deposition (CVD) method on an SiC single crystal substrate by a sublimation method; a method of bonding an SiC single crystal substrate by the sublimation method to an SiC CVD polycrystalline substrate and also form an SiC epitaxial growth layer on the SiC single crystal substrate by the CVD method; and the like.

Conventionally, there have been provided devices made of SiC, such as Schottky Barrier Diodes (SBDs), Metal Oxide Semiconductor Field Effect Transistors (MOSFETs), and Insulated Gate Bipolar Transistors (IGBTs), for power control applications.

DESCRIPTION OF EMBODIMENTS

Figure 1:
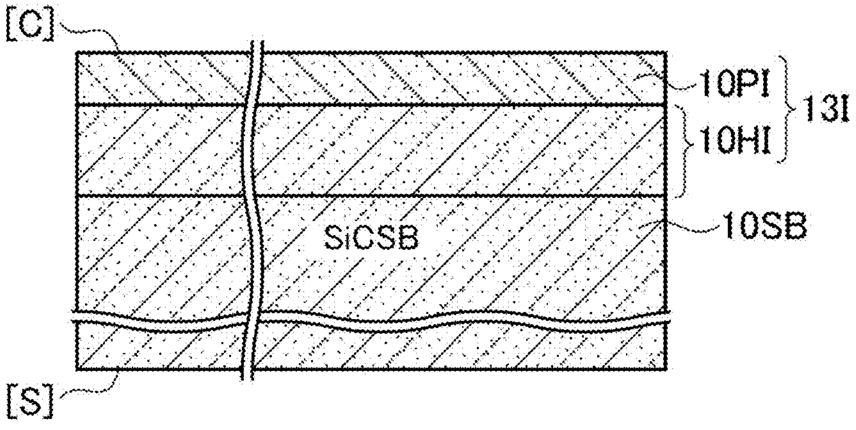
FIG. 1 illustrates a fabrication method of a semiconductor substrate according to a first embodiment, which illustrates a cross-sectional diagram of a structure in which a hydrogen ion implantation layer and a phosphorus ion implantation layer are formed on a C plane of an SiC single crystal substrate.

Next, certain embodiments will now be explained with reference to drawings. In the description of the following drawings to be explained, the identical or similar reference sign is attached to the identical or similar part. However, the drawings are merely schematic.

Moreover, the embodiments described hereinafter merely exemplify the device and method for materializing the technical idea; and the embodiments do not specify the material, shape, structure, placement, etc. of each part as the following. The embodiments disclosed herein may be differently modified.

In the following description of the embodiments, [C] means a C plane of SiC and [S] means an Si plane of SiC.

SiC semiconductor substrates on which such SiC based devices as conventional are formed have been sometimes fabricated by bonding a single-crystal SiC semiconductor substrate onto a polycrystal SiC semiconductor substrate in order to reduce fabricating costs or to provide desired physical properties.

Moreover, in order to grow an epitaxial layer on the single-crystal SiC semiconductor substrate bonded to the polycrystal SiC semiconductor substrate, it has been necessary to bond the high-quality single-crystal SiC semiconductor substrate to the polycrystal SiC semiconductor substrate without defects. However, a polishing process for ensuring surface roughness required in order to bond the single-crystal SiC semiconductor substrate to the polycrystal SiC semiconductor substrate by room temperature bonding or diffusion bonding becomes costly, and a yield may be decreased due to film defects generated at the bonding interface therebetween.

The embodiments provide a low-cost and high-quality semiconductor substrate and a fabrication method of such a semiconductor substrate, and a semiconductor device.

According to one aspect of the embodiments, there is provided a semiconductor substrate comprising: a hexagonal SiC single crystal layer; an SiC epitaxial growth layer disposed on an Si plane of the SiC single crystal layer; and an SiC polycrystalline growth layer disposed on a C plane opposite to the Si plane of the SiC single crystal layer.

According to another aspect of the embodiments, there is provided a semiconductor device comprising the above-described semiconductor substrate.

According to still another aspect of the embodiments, there is provided a fabrication method for a semiconductor substrate, the fabrication method comprising: forming a hydrogen ion implantation layer on a C plane of an SiC single crystal substrate; forming an SiC polycrystalline growth layer on a C plane of the SiC single crystal substrate; forming a single crystal SiC thin layer by weakening the hydrogen ion implantation layer upon forming the SiC polycrystalline growth layer; removing a first stacked structure including the single crystal SiC thin layer and the SiC polycrystalline growth layer from the SiC single crystal substrate; smoothing a surface of the removed single crystal SiC thin layer; and forming an SiC epitaxial growth layer on the smoothed surface of the single crystal SiC thin layer.

According to yet another aspect of the embodiments, there is provided a fabrication method for a semiconductor substrate, the fabrication method comprising: forming a hydrogen ion implantation layer on ab Si plane of ab SiC single crystal substrate; forming an SiC epitaxial growth layer on the Si plane of the SiC single crystal substrate; forming a single crystal SiC thin layer by weakening the hydrogen ion implantation layer upon forming the SiC epitaxial growth layer; bonding a provisional substrate to an Si plane of the SiC epitaxial growth layer; removing a second stacked structure including the single crystal SiC thin layer, the SiC epitaxial growth layer, and the provisional substrate from the SiC single crystal substrate; smoothing a surface of the removed single crystal SiC thin layer; and forming an SiC polycrystalline growth layer on the smoothed surface of the single crystal SiC thin layer.

First Embodiment (Semiconductor Substrate)

Figure 5:
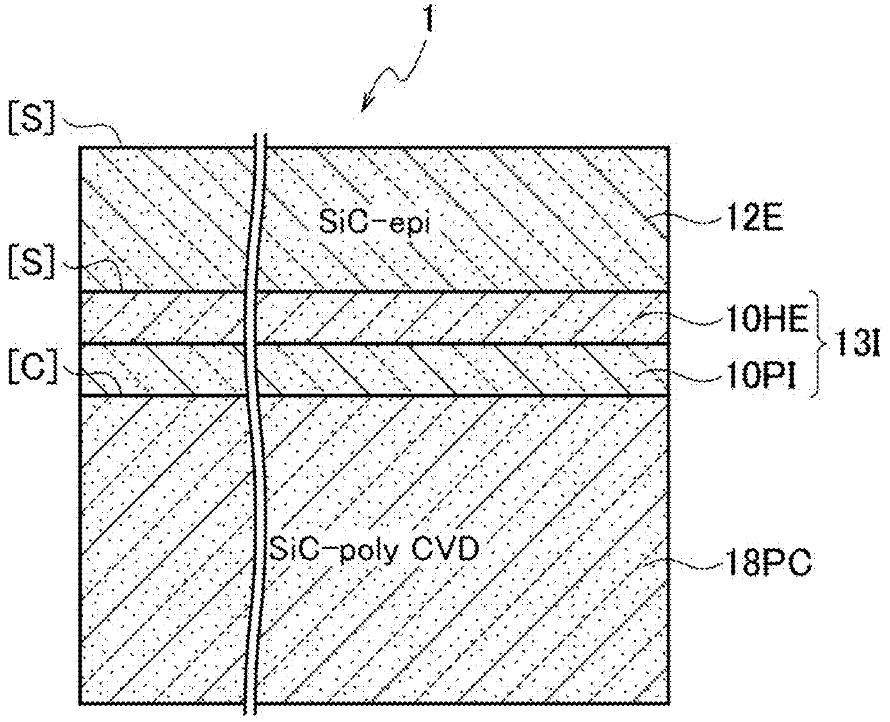
FIG. 5 illustrates the fabrication method of the semiconductor substrate according to the first embodiment, which illustrates a cross-sectional diagram of a structure in which an SiC epitaxial growth layer is formed on the SiC thin layer.

As illustrated in FIG. 5, a semiconductor substrate 1 according to a first embodiment includes: a hexagonal SiC single crystal layer 13I; an SiC epitaxial growth layer (SiC-epi) 12E disposed on an Si plane of the SiC single crystal layer 13I; and an SiC polycrystalline growth layer (SiC-poly CVD) 18PC disposed on a C plane opposite to the Si plane of the SiC single crystal layer 13I.

The SiC single crystal layer 13I includes a single crystal SiC thin layer 10HE, as illustrated in FIG. 5. The single crystal SiC thin layer 10HE includes a first ion implantation layer. The first ion implantation layer includes a hydrogen ion implantation layer 10HI, as illustrated in FIG. 5. The single crystal SiC thin layer 10HE includes a weakened layer of the hydrogen ion implantation layer 10HI. The SiC single crystal layer 13I may includes a second ion implantation layer. Here, the second ion implantation layer is disposed between the single crystal SiC thin layer 10HE and the SiC polycrystalline growth layer 18PC, as illustrated in FIG. 5. The second ion implantation layer may include a phosphorus ion implantation layer 10PI, as illustrated in FIG. 5.

Here, the Si plane of the SiC single crystal layer 13I is, for example, a [0001] oriented plane of 4H—SiC, and the C plane of the SiC single crystal layer 13I is a [000-1] oriented plane of 4H—SiC.

Moreover, the SiC single crystal substrate 10SB can be reused by being removed from the SiC epitaxial growth layer 12E.

(Fabrication Method)

FIG. 1 illustrates a fabrication method of the semiconductor substrate according to the first embodiment, which illustrates a cross-sectional diagram of a structure in which a hydrogen ion implantation layer 10HI and a phosphorus ion implantation layer 10PI are sequentially formed on a C plane of an SiC single crystal substrate (SiCSB) 10SB.

Figure 2:
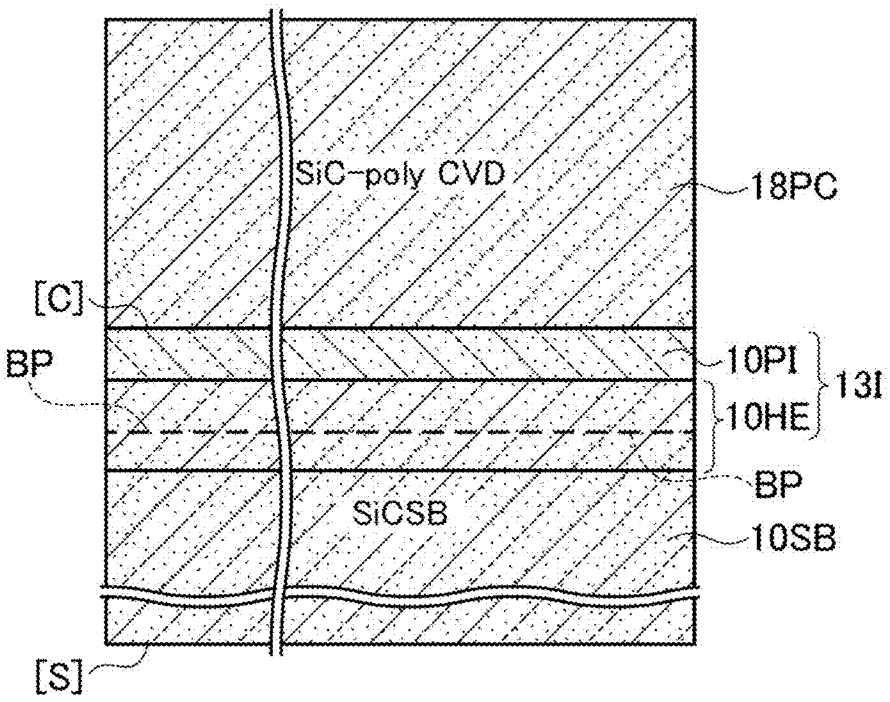
FIG. 2 illustrates the fabrication method of the semiconductor substrate according to the first embodiment, which illustrates a cross-sectional diagram of a structure in which an SiC polycrystalline growth layer is formed by a CVD method on a C plane of the phosphorus ion implantation layer.

FIG. 2 illustrates the fabrication method of the semiconductor substrate according to the first embodiment, which illustrates a cross-sectional diagram of a structure in which an SiC polycrystalline growth layer (SiC-poly CVD) 18PC is formed on a C plane of the phosphorus ion implantation layer 10PI by the CVD method.

Figure 3A:
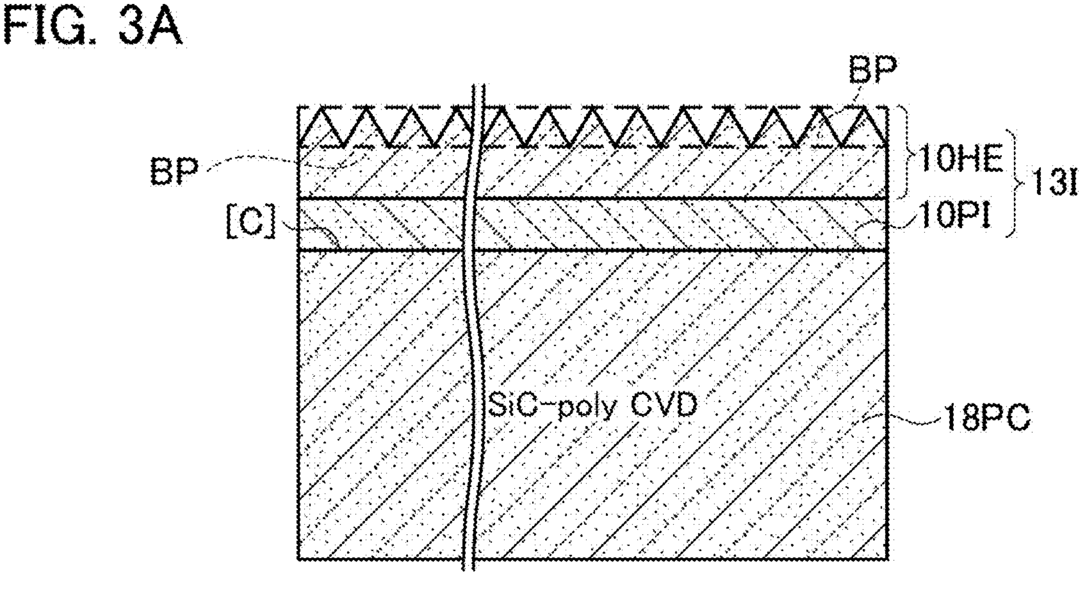
FIG. 3A illustrates the fabrication method of the semiconductor substrate according to the first embodiment, and which illustrates a cross-sectional diagram of a structure in which the SiC polycrystalline growth layer and an SiC single crystal layer on the SiC polycrystalline growth layer are formed after being separated from the SiC single crystal substrate via a removed surface in the single crystal SiC thin layer.

FIG. 3A illustrates the fabrication method of the semiconductor substrate according to the first embodiment, which illustrates a cross-sectional diagram of a structure in which the SiC single crystal substrate 10SB is separated therefrom via a removed surface BP in the single crystal SiC thin layer 10HE, and the SiC polycrystalline growth layer 18PC and the SiC single crystal layer 13I on the SiC polycrystalline growth layer 18PC are formed.

Figure 3B:
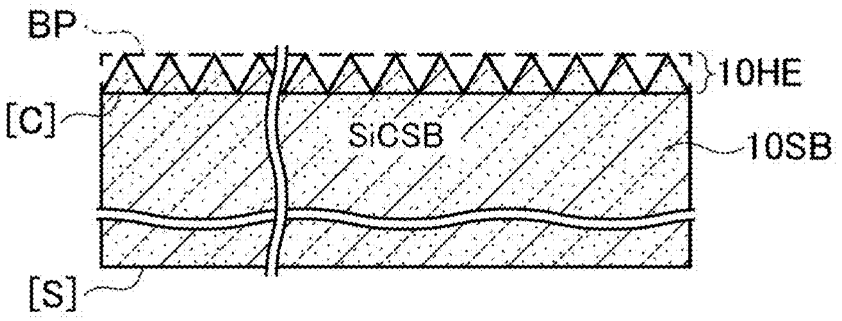
FIG. 3B illustrates a cross-sectional diagram of a structure of the removed and separated SiC single crystal substrate.

On the other hand, FIG. 3B illustrates a cross-sectional diagram of a structure in which the SiC single crystal substrate 10SB which is removed and separated.

Figure 4:
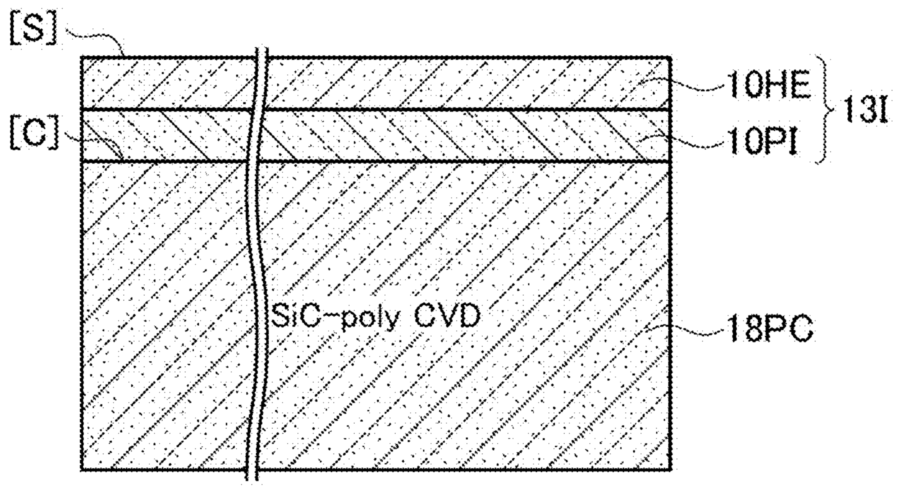
FIG. 4 illustrates the fabrication method of the semiconductor substrate according to the first embodiment, which illustrates a cross-sectional diagram of a structure in which an Si plane of the SiC single crystal layer is polished.

FIG. 4 illustrates the fabrication method of the semiconductor substrate according to the first embodiment, which illustrates a cross-sectional diagram of a structure in which an Si plane of the SiC single crystal layer 13I is polished.

FIG. 5 illustrates the fabrication method of the semiconductor substrate according to the first embodiment, which illustrates a cross-sectional diagram of a structure in which an SiC epitaxial growth layer 12E is formed on the Si plane of SiC single crystal layer 13I.

(Ion Implantation Removing Method)

An ion implantation removing method is applied to the fabrication method of the semiconductor substrate according to the first embodiment. By performing the ion implantation removing method, the single crystal SiC thin layer 10HE can be formed on the surface of the SiC single crystal substrate 10SB. The ion implantation removing method has the following processes.

(a) First, ion implantation of hydrogen is performed on the Si plane of the hexagonal SiC single crystal substrate 10SB, and the hydrogen ion implantation layer 10HI is formed at a predetermined depth.

(b) Next, annealing treatment is performed to weaken the hydrogen ion implantation layer 10HI, and the single crystal SiC thin layer 10HE is formed. The weakened hydrogen ion implantation layer 10HI becomes the single crystal SiC thin layer 10HE. In this case, the annealing treatment is a weakening thermal annealing process. This process is a process for generating hydrogen microbubbles after the ion implantation of hydrogen to facilitate breaking of the single crystal SiC thin layer 10HE. In the single crystal SiC thin layer 10HE, a removed surface BP is formed when applying a stress, such as a shear stress.

The fabrication method of the semiconductor substrate according to the first embodiment is a fabrication method of a semiconductor substrate 1 including a single crystal SiC thin layer 10HE and an SiC epitaxial growth layer 12E on an SiC polycrystalline growth layer 18PC. The fabrication method includes: thinning a surface of a hexagonal SiC single crystal substrate 10SB by an ion implantation removing method; epitaxially growing a single crystal SiC on a first plane of the thinned SiC single crystal layer 13I; and directly growing an SiC polycrystalline growth layer 18PC by a CVD method on a second plane of the thinned SiC single crystal layer 13I. Here, an interface bonding of a first plane and an interface bonding of a second plane both use no substrate bonding method.

Moreover, the fabrication method of the semiconductor substrate according to the first embodiment includes thinning a (000-1) C surface of the hexagonal SiC single crystal substrate 10SB by an ion implantation removing method.

The fabrication method of the semiconductor substrate according to the first embodiment includes the following processes. More specifically, the fabrication method includes: forming a hydrogen ion implantation layer 10HI on a C plane of an SiC single crystal substrate 10SB; forming an SiC polycrystalline growth layer 18PC on a C plane of the SiC single crystal substrate 10SB; forming a single crystal SiC thin layer 10HE by weakening the hydrogen ion implantation layer 10HI upon forming the SiC polycrystalline growth layer 18PC; removing a first stacked structure including the single crystal SiC thin layer 10HE and the SiC polycrystalline growth layer 18PC from the SiC single crystal substrate 10SB; smoothing a surface of the removed single crystal SiC thin layer 10HE; and forming an SiC epitaxial growth layer 12E on the smoothed surface of the single crystal SiC thin layer 10HE.

Hereinafter, the fabrication method of a semiconductor substrate according to the first embodiment will be described in detail, with reference to drawings.

(A) First, as illustrated in FIG. 1, hydrogen ions are implanted into the C plane of the hexagonal SiC single crystal substrate (SiCSB) 10SB. When the hydrogen ions are implanted into the C plane of the SiC single crystal substrate 10SB, the hydrogen ions reach a depth corresponding to the incident energy and are distributed over at a high concentration. Consequently, as illustrated in FIG. 1, the hydrogen ion implantation layer 10HI is formed at the predetermined depth from the surface.

The hydrogen ion implantation layer 10HI having the specified depth (approximately 0.5 μm to approximately 1 μm) is formed by the hydrogen ion implantation with the ion implantation removing method. In this case, as ion implantation conditions, an accelerating energy is, for example, approximately 100 keV, and a dosage is, for example, approximately $2.0\times10^{17}/cm^2$.

(B) Next, as illustrated in FIG. 1, another ion (P ion or the like) for lowering an electric resistance value of a stacking contact interface may be implanted into the C plane of the SiC single crystal substrate 10SB. In this case, a depth of the phosphorus ion implantation layer 10PI is, for example, approximately 0.01 μm to approximately 0.5 μm. In this case, as ion implantation conditions, an accelerating energy is, for example, approximately 10 keV to approximately 180 keV, and a dosage is, for example, approximately $4\times10^{15}/cm^2$ to approximately $6\times10^{16}/cm^2$.

(C) Next, as illustrated in FIG. 2, the SiC polycrystalline growth layer 18PC is formed on the C plane of the SiC single crystal substrate 10SB. Here, the SiC polycrystalline growth layer 18PC can be deposited on the C plane of the SiC single crystal substrate 10SB by, for example, the CVD method. A thickness of the SiC polycrystalline growth layer 18PC is preferably, for example, approximately 150 μm to approximately 500 μm. The thickness of the semiconductor substrate 1 (refer to FIG. 5) is adjusted to approximately 150 μm to approximately 500 μm as required. In this case, the thickness of the semiconductor substrate 1 is the sum of the thickness of the SiC polycrystalline growth layer 18PC, the thickness of the SiC single crystal layer 13I, and the thickness of the SiC epitaxial growth layer 12E, as illustrated in FIG. 5.

The hydrogen ion implantation layer 10HI can be weakened simultaneously with a high temperature process performed during the deposition of the SiC polycrystalline growth layer 18PC. Further, at the same time, activation annealing for hydrogen ions, phosphorus ions, and the like is performed. The hydrogen ion implantation layer 10HI is weakened simultaneously with the annealing process during the formation of the SiC polycrystalline growth layer 18PC, and the single crystal SiC thin layer 10HE is formed.

Of the two ion implantations int the C plane of the SiC single crystal substrate 10SB, the first is the hydrogen ion implantation for the ion implantation removing method. After implanting the hydrogen ions (protons), hydrogen microbubbles are generated to weaken the hydrogen ion implantation layer 10HI. When the hydrogen ions are implanted, the hydrogen ions accumulate at a depth of approximately 1 μm. Here, when a thermal annealing process is performed, the hydrogen ions gasify and a porous layer is formed inside the SiC single crystal substrate 10SB. This porous layer weakens the SiC single crystal substrate 10SB, and the weakened layer of the hydrogen ion implantation layer 10HI, i.e., the single crystal SiC thin layer 10HE is formed. As illustrated in FIG. 2, the single crystal SiC thin layer 10HE is made easier to break at the broken plane BP. Due to the weakening of the hydrogen ion implantation layer 10HI, it is possible to avoid an occurrence of crystal defects or an occurrence of warpage due to a difference in the Coefficient of Thermal Expansion (CTE) between the SiC single crystal substrate 10SB and the SiC polycrystalline growth layer 18PC.

The second ion implantation is phosphorus ion implantation for ohmic contact resistance reduction of the contact interface between the SiC single crystal substrate 10SB and the SiC polycrystalline growth layer 18PC, and multiple phosphorus ion implantation is performed so that a donor concentration near the implantation surface is approximately $1\times10^{18}/cm^3$ to approximately $1\times10^{27}$ $cm^3$. After performing the implanting, activation thermal annealing is required to activate the phosphorus ions and improve the donor concentration.

Both annealing are simultaneously realized by heating the substrate during the deposition of the SiC polycrystalline growth layer 18PC by the CVD method.

(D1) Next, as illustrated in FIG. 3A, the stacked structure (18PC, 10PI, 10HE) including the single crystal SiC thin layer 10HE, the phosphorus ion implantation layer 10HP, and the SiC polycrystalline growth layer 18PC is removed from the SiC single crystal substrate 10SB. In this case, the removing process is performed at the removed surface BP of the single crystal SiC thin layer 10HE subjected to the weakening process.

(D2) On the other hand, as illustrated in FIG. 3B, on the C plane of the removed SiC single crystal substrate 10SB, a concavity and convexity structure of the single crystal SiC thin layer 10HE is exposed. A mechanical polishing method and a mechanical-chemical polishing method are sequentially used for the concavity and convexity structure of this single crystal SiC thin layer 10HE to smooth the Si plane of the SiC single crystal substrate 10SB. The C plane of the SiC single crystal substrate 10SB has an average surface roughness Ra of, for example, equal to or less than approximately 1 nm after performing the above-mentioned process. Consequently, the SiC single crystal substrate 10SB can be reused. The SiC single crystal substrate 10SB can be reused.

(E) Next, as illustrated in FIG. 4, the mechanical polishing method and the mechanical-chemical polishing method are sequentially used for the surface of the removed single crystal SiC thin layer 10HE to smooth the surface thereof. The Si plane of the single crystal SiC thin layer 10HE has an average surface roughness Ra of, for example, equal to or less than approximately 1 nm after performing the above-mentioned process.

(F) Next, as illustrated in FIG. 5, the homoepitaxial crystal layer is grown by the CVD method on the smoothed surface to form the SiC epitaxial growth layer 12E having excellent crystallinity. In addition, the CVD apparatus for forming the SiC epitaxial growth layer 12E by the homoepitaxial growth may be the same CVD apparatus for forming the SiC polycrystalline growth layer 18PC on the C plane of the SiC single crystal substrate 10SB, or may be configured as a separate dedicated apparatus.

In accordance with the above-mentioned processes, the semiconductor substrate according to the first embodiment can be formed.

In accordance with the first embodiment, the single crystal SiC thin layer is formed by the ion implantation removing method into the C plane of the hexagonal SiC single crystal substrate, and also the direct growth of the SiC polycrystalline layer on the C plane of a single crystal SiC thin layer is combined therewith, and thereby it is possible to provide the semiconductor substrate and the fabrication method thereof using no substrate bonding method between the SiC epitaxial growth layer and the SiC polycrystalline layer.

In accordance with the first embodiment, the single crystal SiC thin layer is formed on the C plane of the SiC single crystal substrate by the ion implantation removing method and the SiC polycrystalline layer is directly deposited on the single crystal SiC thin layer by the CVD method, and thereby it is possible to provide the semiconductor substrate and fabrication method thereof in which the bonding process between the SiC epitaxial growth layer and the SiC polycrystalline growth layer can be eliminated and the fabricating cost can be reduced by simplifying the fabricating process.

In accordance with the fabrication method of the semiconductor substrate according to the first embodiment, it is possible to fabricate a semiconductor substrate having the stacked structure including the SiC epitaxial growth layer and the SiC polycrystalline growth layer by the combination technique of the ion implantation removing method and the CVD direct deposition technique, without bonding the substrate.

In accordance with the first embodiment, since the hexagonal SiC single crystal substrate is to be thin-layered and the epitaxial growth layer is formed by performing the homoepitaxial growth on the single crystal SiC thin layer, the Si plane of the hexagonal SiC epitaxial growth layer can be obtained on the fabrication plane of the device. In addition, although the SiC single crystal substrate, which is more expensive than the Si substrate, is used as a seed substrate, the cost is not much different from that of using the Si substrate since the seed substrate can be reused more than several dozen times.

In accordance with the first embodiment, since the SiC single crystal substrate is used as a base, formation of the single crystal SiC thin layer by the ion implantation removing method is fundamental, but it is not necessary to eliminate a holding substrate by polishing or etching and the hexagonal SiC epitaxial growth layer can be obtained, therefore it can used as a semiconductor substrate for SiC based power devices.

The first embodiment corresponds to the fabrication method of the semiconductor substrate including the SiC epitaxial growth layer on the SiC polycrystalline substrate, and on the (000-1) C surface of the hexagonal single crystal SiC substrate, the SiC polycrystalline growth layer is directly deposited by the thermal CVD method on the single crystal SiC thin layer on which the surface of the SiC single crystal substrate is thinned using the ion implantation removing method, and thereby it is possible to eliminate the substrate bonding between the SiC epitaxial growth layer and the SiC polycrystalline growth layer and to reduce the fabricating cost by simplifying the fabricating process.

The first embodiment can provide the following effects (1) to (6).

(1) Since substrate bonding required for fabrication of composite substrates using a conventional ion implantation removing method is not used, it is possible to eliminate the yield deterioration due to bonding defects and voids caused by bonding. Moreover, man-hours are reduced, fixed and variable cost losses due to defects are reduced, and productivity and quality are improved.

(2) Precise polishing process for ensuring bondability is no longer required, and the high cost due to defective losses and increased processing costs is eliminated, thereby enabling the provision of the inexpensive SiC composite substrate.

(3) Since the interface contact resistance value can be reduced by performing ion implantation in advance into one side of the contact surface between the SiC polycrystalline growth layer and the single crystal SiC epitaxial growth layer, and by performing high-concentration doping control to another side during the film formation, it is possible to reduce the ohmic contact resistance and to reduce the driving voltage peculiar to the composite substrates.

(4) Since high-concentration autodoping can be performed for the thermal CVD method during deposition of the SiC polycrystalline growth layer, the electric resistance value of bulk can be reduced a resistance value equivalent to an SiC single crystal substrate fabricated by the sublimation method.

(5) Of two ion implantations into the C plane of the SiC single crystal substrate, the first ion implantation is the hydrogen ion implantation for the ion implantation removing method, and after performing the ion implantation, the weakening thermal annealing is required to generate the hydrogen microbubbles to facilitate breaking the thinned layer. The second ion implantation is the phosphorus ion implantation for reduction of the contact interface resistance (ohmic contact) between the single crystal SiC and the polycrystal SiC, and after performing the implanting, the activation thermal annealing is required to activate the phosphorus ions and improve the donor concentration. Since both annealing processes are simultaneously realized by heating the substrate during the deposition of the SiC polycrystalline growth layer by the CVD, there is no need to perform these annealing processes separately, thereby reducing the fabricating cost.

(6) Since the removal phenomenon due to the weakening annealing effect is generated before the thick film deposition of the SiC polycrystalline growth layer by the CVD, the coefficient of thermal expansion mismatch between the SiC single crystal substrate and the SiC polycrystalline growth layer can be mitigated, thereby suppressing warpage.

Second Embodiment (Semiconductor Substrate)

Figure 11:
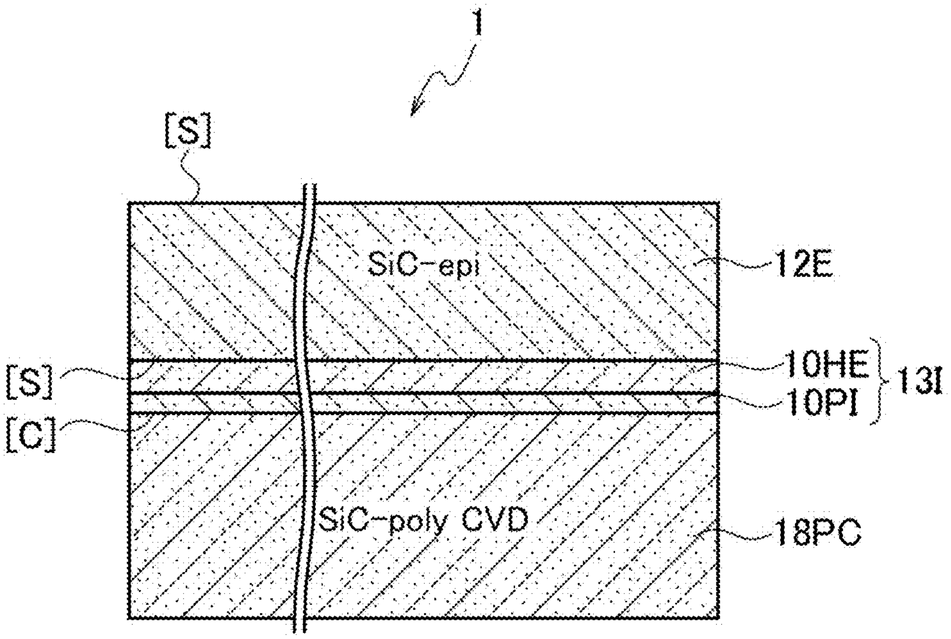
FIG. 11 illustrates a fabrication method of a semiconductor substrate according to a second embodiment, which illustrates a cross-sectional diagram of a structure from which the carbon tray is eliminated.

As illustrated in FIG. 11, a semiconductor substrate 1 according to a second embodiment includes: a hexagonal SiC single crystal layer 13I; an SiC epitaxial growth layer 12E disposed on an Si plane of the SiC single crystal layer 13I; and an SiC polycrystalline growth layer 18PC disposed on a C plane opposite to the Si plane of the SiC single crystal layer 13I.

The SiC single crystal layer 13I includes a single crystal SiC thin layer 10HE. The single crystal SiC thin layer 10HE includes a first ion implantation layer. The first ion implantation layer includes a hydrogen ion implantation layer 10HI. The single crystal SiC thin layer 10HE includes a weakened layer of the hydrogen ion implantation layer 10HI. The SiC single crystal layer 13I may includes a second ion implantation layer. The second ion implantation layer is disposed between the first ion implantation layer and the SiC polycrystalline growth layer. The second ion implantation layer may include a phosphorus ion implantation layer 10PI.

Here, the Si plane of the SiC single crystal layer 13I is, for example, a [0001] oriented plane of 4H—SiC, and the C plane of the SiC single crystal layer 13I is, for example, a [000-1] oriented plane of 4H—SiC.

Moreover, the SiC single crystal substrate 10SB can be reused by being removed from the SiC epitaxial growth layer 12E.

(Fabrication Method)

Figure 6:
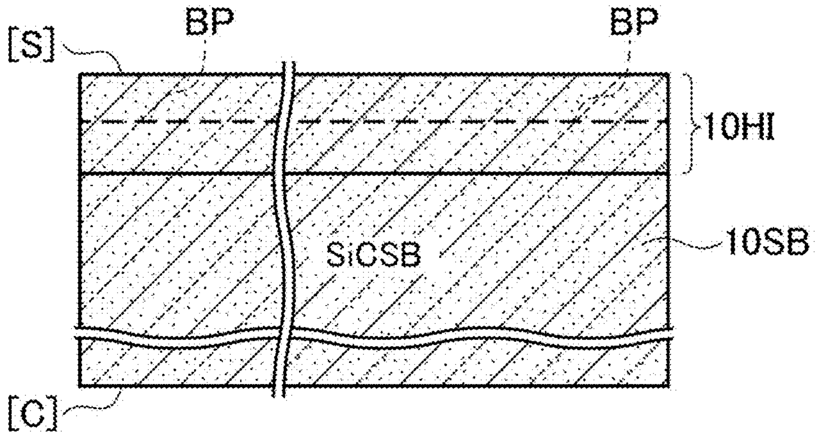
FIG. 6 illustrates the fabrication method of the semiconductor substrate according to the second embodiment, which illustrates a cross-sectional diagram of a structure in which a hydrogen ion implantation layer is formed on an Si plane of the SiC single crystal substrate.

FIG. 6 illustrates a fabrication method of the semiconductor substrate according to the second embodiment, which illustrates a cross-sectional diagram of a structure in which a hydrogen ion implantation layer 10HI is formed on an Si plane of the SiC single crystal substrate 10SB.

Figure 7:
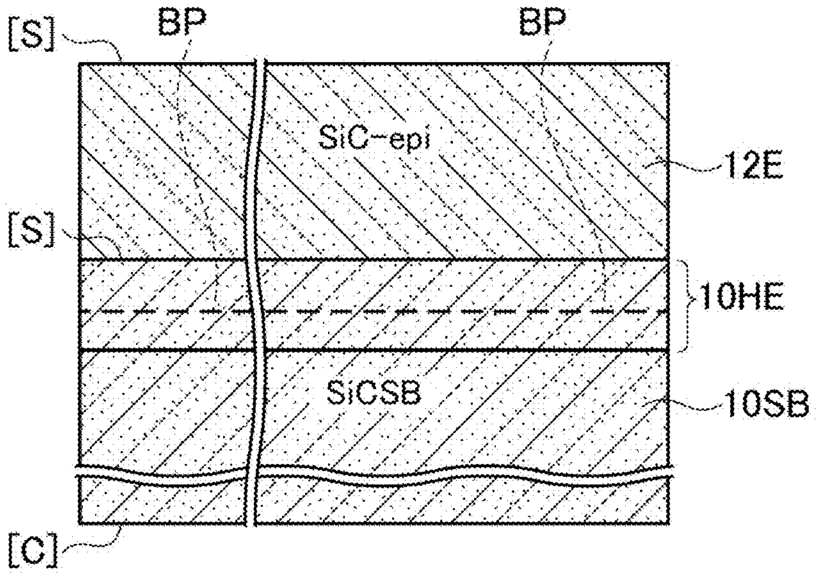
FIG. 7 illustrates the fabrication method of the semiconductor substrate according to the second embodiment, which illustrates a cross-sectional diagram of a structure in which after weakening the hydrogen ion implantation layer and forming a single crystal SiC thin layer by annealing treatment of the hydrogen ion implantation layer, an SiC epitaxial growth layer is formed on an Si plane of the single crystal SiC thin layer.

FIG. 7 illustrates the fabrication method of the semiconductor substrate according to the second embodiment, which illustrates a cross-sectional diagram of a structure in which after weakening the hydrogen ion implantation layer 10HI and forming a single crystal SiC thin layer 10HE by annealing treatment of the hydrogen ion implantation layer 10HI, an SiC epitaxial growth layer 12E is formed on an Si plane of the single crystal SiC thin layer 10HE.

Figure 8:
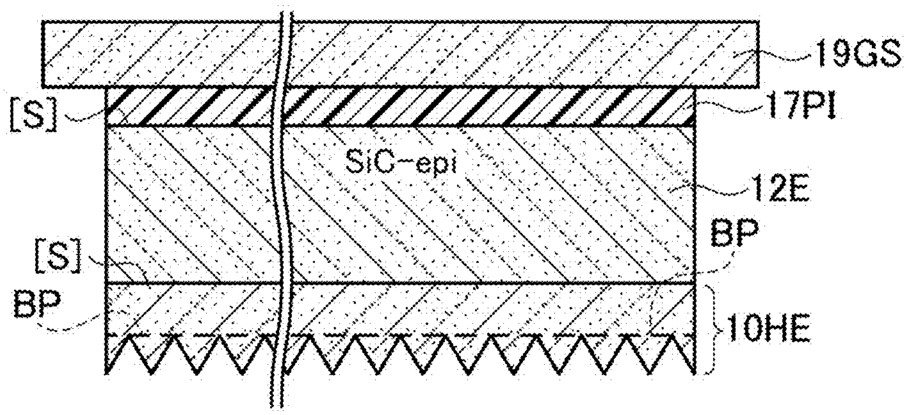
FIG. 8 illustrates the fabrication method of the semiconductor substrate according to the second embodiment, which illustrates a cross-sectional diagram of a structure in which after coating a bonding layer in an Si plane of the SiC epitaxial growth layer and bonding a graphite substrate thereto, an SiC single crystal substrate is removed and separated therefrom via a single crystal SiC thin layer formed by weakening annealing.

FIG. 8 illustrates the fabrication method of the semiconductor substrate according to the second embodiment, which illustrates a cross-sectional diagram of a structure in which after coating a bonding layer 17PI in an Si plane of the SiC epitaxial growth layer 12E and bonding a graphite substrate 19GS thereto, an SiC single crystal substrate 10SB is removed and separated therefrom via the weakened single crystal SiC thin layer 10HE.

Figure 9:
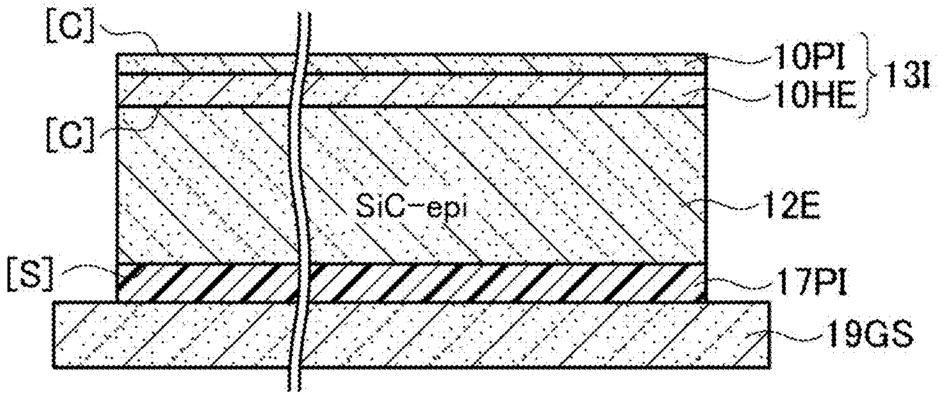
FIG. 9 illustrates the fabrication method of the semiconductor substrate according to the second embodiment, which illustrates a cross-sectional diagram of a structure in which after smoothing a removed surface of the single crystal SiC thin layer, phosphorus ion implantation is performed in a C plane of the single crystal SiC thin layer to form a phosphorus ion implantation layer.

FIG. 9 illustrates the fabrication method of the semiconductor substrate according to the second embodiment, which illustrates a cross-sectional diagram of a structure in which after smoothing a removed surface of the single crystal SiC thin layer 10HE, phosphorus ion implantation is performed in a C plane of the single crystal SiC thin layer 10HE to form a phosphorus ion implantation layer 10PI.

Figure 10:
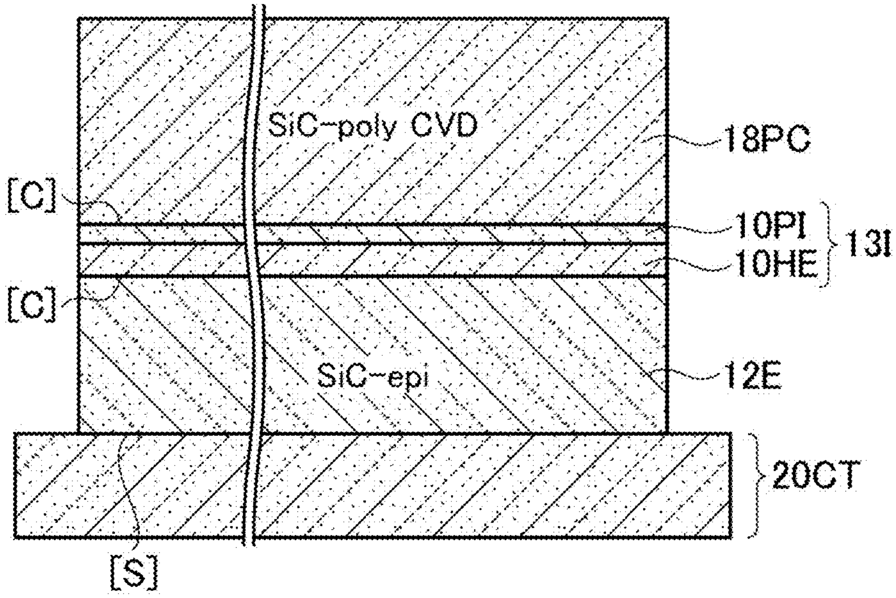
FIG. 10 illustrates a cross-sectional diagram of a structure in which the adhesive is eliminated, the graphite substrate is separated from a stacked structure including the single crystal SiC thin layer and the SiC epitaxial growth layer, and the separated stacked structure including the single crystal SiC thin layer and the SiC epitaxial growth layer is mounted so that an Si plane thereof is in contact with a carbon tray, and a C plane thereof is exposed facing up and an SiC polycrystalline growth layer is formed on the C plane by the CVD method.

FIG. 10 illustrates the fabrication method of the semiconductor substrate according to the second embodiment, which illustrates a cross-sectional diagram of a structure in which the adhesive 17PI is eliminated, the graphite substrate 19GS is separated from a stacked structure including the single crystal SiC thin layer 10HE and the SiC epitaxial growth layer 12E, and the separated stacked structure including the single crystal SiC thin layer 10HE and the SiC epitaxial growth layer 12E is mounted so that an Si plane thereof is in contact with a carbon tray 20CT, and a C plane thereof is exposed facing up and an SiC polycrystalline growth layer 18PC is formed on the C plane by the CVD method.

FIG. 11 illustrates a fabrication method of a semiconductor substrate according to a second embodiment, which illustrates a cross-sectional diagram of a structure from which the carbon tray 20CT is eliminated.

(Ion Implantation Removing Method)

An ion implantation removing method is applied to the fabrication method of the semiconductor substrate according to the second embodiment. By performing the ion implantation removing method, the single crystal SiC thin layer 10HE is formed from the SiC single crystal substrate 10SB. The ion implantation removing method has the following processes.

(a) First, ion implantation of hydrogen is performed on the C plane of the hexagonal SiC single crystal substrate 10SB, and the hydrogen ion implantation layer 10HI is formed at a predetermined depth.

(b) Next, when annealing treatment is performed, the hydrogen ion implantation layer 10HI is weakened, and the single crystal SiC thin layer 10HE is formed. The weakened hydrogen ion implantation layer 10HI becomes the single crystal SiC thin layer 10HE. The weakening thermal annealing is required for generating hydrogen microbubbles after the ion implantation of hydrogen to facilitate breaking of the single crystal SiC thin layer 10HE. In the single crystal SiC thin layer 10HE, a removed surface BP is formed when applying a stress.

The fabrication method according to the second embodiment is a fabrication method of a semiconductor substrate 1 including a single crystal SiC thin layer 10HE and an SiC epitaxial growth layer 12E on an SiC polycrystalline growth layer 18PC. The fabrication method includes: thinning a surface of a hexagonal SiC single crystal substrate 10SB by an ion implantation removing method; epitaxially growing a single crystal SiC on a first plane of the thinned SiC single crystal layer 13I; and directly growing an SiC polycrystalline growth layer 18PC by a CVD method on a second plane of the thinned SiC single crystal layer 13I. Here, an interface bonding of a first plane and an interface bonding of a second plane both use no substrate bonding method.

Moreover, the fabrication method of the semiconductor substrate according to the second embodiment includes thinning a (0001) Si surface of the hexagonal SiC single crystal substrate 10SB by an ion implantation removing method.

In accordance with the second embodiment, it is possible to provide the fabrication method of the semiconductor substrate having the stacked structure including the SiC single crystal substrate 10SB and the SiC polycrystalline growth layer 18PC by the combination technique of the ion implantation removing method and the CVD direct deposition technique, without bonding the substrate.

The fabrication method of the semiconductor substrate according to the second embodiment includes the following processes. More specifically, the fabrication method includes: forming a hydrogen ion implantation layer 10HI on an Si plane of an SiC single crystal substrate 10SB; forming an SiC epitaxial growth layer 12E on an Si plane of the SiC single crystal substrate 10SB, and weakening the hydrogen ion implantation layer 10HI to form a single crystal SiC thin layer 10HE; bonding a provisional substrate on an Si plane of the SiC epitaxial growth layer 12E; removing the stacked structure including the single crystal SiC thin layer 10HE and the SiC epitaxial growth layer 12E from the SiC single crystal substrate 10SB; smoothing a surface of the removed single crystal SiC thin layer 10HE; and forming an SiC polycrystalline growth layer 18PC on the smoothed surface of the single crystal SiC thin layer 10HE.

Hereinafter, the fabrication method of the semiconductor substrate according to the second embodiment will be described in detail with reference to drawings.

(G1) First, as illustrated in FIG. 6, hydrogen ions for an ion implantation removing method are implanted into the Si plane of the hexagonal SiC single crystal substrate 10SB to form the hydrogen ion implantation layer 10HI having a specified depth (approximately 1 μm). In this case, as ion implantation conditions, an accelerating energy is, for example, approximately 100 keV, and a dosage is, for example, approximately $2.0\times10^{17}/cm^2$.

(G2) Next, the hydrogen ion implantation layer 10HI is subjected to a high temperature process to weaken the hydrogen ion implantation layer 10HI. The weakening thermal annealing is required for generating hydrogen microbubbles after the ion implantation of hydrogen to facilitate breaking of the single crystal SiC thin layer 10HE.

(H) Next, as illustrated in FIG. 7, the SiC epitaxial growth layer 12E is formed by growing the homoepitaxial crystal layer on the Si plane of the single crystal SiC thin layer 10HE by the CVD method.

(I) Next, as illustrated in FIG. 8, the substrate structure illustrated in FIG. 7 is extracted from the CVD homoepitaxial growth furnace, the provisional substrate is bonded on an Si plane of the SiC epitaxial growth layer 12E by adhesive 17PI, in the stacked structure including the SiC single crystal substrate 10SB, the single crystal SiC thin layer 10HE, and the SiC epitaxial growth layer 12E. For example, the graphite substrate 19GS or a silicon substrate such as a sintered silicon substrate can be applied to the provisional substrate. In this case, an organic adhesive, such as a polyimide-based adhesive, for example, is used for the bonding layer 17PI. Organic adhesives, such as epoxy-based adhesive or acrylic adhesive, may be used as other adhesives. When the provisional substrate (graphite substrate 19GS) having an outside size larger by one size than the SiC single crystal substrate 10SB is inserted into a wafer boat groove of a batch-type vertical CVD furnace to be aligned, there is an advantage that a trace of a wafer boat support is outside a substrate effective area.

(J) Next, as illustrated in FIG. 8, the single crystal SiC thin layer 10HE and the SiC epitaxial growth layer 12E bonded to the graphite substrate 19GS are removed and separated from the SiC single crystal substrate 10SB.

(K1) Next, as illustrated in FIG. 9, The removed surface of the stacked structure including the single crystal SiC thin layer 10HE and the SiC epitaxial growth layer 12E bonded to the graphite substrate 19GS is sequentially smoothed by mechanical polishing and mechanochemistry polishing method. The C plane of the single crystal SiC thin layer 10HE has an average surface roughness Ra of, for example, equal to or less than approximately 1 nm after performing the above-mentioned process.

(K2) On the other hand, on the Si plane of the removed SiC single crystal substrate 10SB, a concavity and convexity structure of the single crystal SiC thin layer 10HE is exposed. A mechanical polishing method and a mechanical-chemical polishing method are sequentially used for the concavity and convexity structure of this single crystal SiC thin layer 10HE to smooth the Si plane of the SiC single crystal substrate 10SB. The Si plane of the SiC single crystal substrate 10SB has an average surface roughness Ra of, for example, equal to or less than approximately 1 nm after performing the above-mentioned process. Consequently, the SiC single crystal substrate 10SB can be reused. The SiC single crystal substrate 10SB can be reused.

(L) Next, as illustrated in FIG. 9, P (phosphorus) ions for reducing the electric resistance value of the stacking contact interface are implanted into the smoothed plane to form the phosphorus ion implantation layer 10PI. In this case, a depth of the phosphorus ion implantation layer 10PI is, for example, approximately 0.01 μm to approximately 0.5 μm. In this case, as ion implantation conditions, an accelerating energy is, for example, approximately 10 keV to approximately 180 keV, and a dosage is, for example, approximately $4\times10^{15}/cm^2$ to approximately $6\times10^{16}/cm^2$.

(M) Next, although illustration is omitted, the adhesive 17PI is eliminated by wet etching, an organic solvent, or the like, and the stacked structure including the single crystal SiC thin layer 10HE and the SiC epitaxial growth layer 12E and the graphite substrate 19GS are separated from each other.

(N) Next, as illustrated in FIG. 10, the separated stacked structure including the single crystal SiC thin layer 10HE and the SiC epitaxial growth layer 12E is mounted so that the Si plane thereof is in contact with the carbon tray 20CT, and the C plane thereof is exposed facing up and the SiC polycrystalline growth layer 18PC is deposited on the C plane by the CVD method, and at the same time, activation and crystal damage recovery annealing is performed.

(O) Next, as illustrated in FIG. 11, the stacked structure including the single crystal SiC thin layer 10HE, the SiC epitaxial growth layer 12E, and the SiC polycrystalline growth layer 18PC, and the carbon tray 20CT are separated from each other, and the outer peripheral portion and substrate both surfaces are processed into a predetermined shape and surface state. In addition, the CVD apparatus for forming the SiC epitaxial growth layer 12E by homoepitaxially growing on the Si plane of the single crystal SiC thin layer 10HE by the CVD method may be the same CVD apparatus for forming the SiC polycrystalline growth layer 18PC on the C plane of the single crystal SiC thin layer 10HE by the CVD method, or may be configured as a separate dedicated apparatus.

In accordance with the above-mentioned processes, the semiconductor substrate 1 according to the second embodiment can be formed.

The second embodiment provides the fabrication method of the composite substrate using no substrate bonding method by combining the direct growth of the polycrystal SiC layer by the CVD with the thinning of the single crystal SiC substrate by the ion implantation removing method into the Si plane of the hexagonal system single crystal SiC substrate.

The polycrystal SiC supporting layer is directly deposited by the CVD method on the single crystal SiC layer thinned to the single crystal layer by using the ion implantation removing method performed on the Si plane of the single crystal SiC substrate, and thereby the bonding process between the single crystal SiC layer and the polycrystal SiC substrate is eliminated, and the fabricating cost is reduced by simplifying the fabricating process.

The second embodiment corresponds to the fabrication method of the SiC composite substrate including the single crystal SiC epitaxial growth layer on the SiC polycrystalline substrate, and on the (000-1) C surface of the hexagonal system single crystal SiC substrate, the polycrystal SiC supporting layer is directly deposited by the thermal CVD method on the single crystal SiC layer on which the surface of the single crystal SiC substrate is thinned using the ion implantation removing method, and thereby the substrate bonding between the single crystal SiC layer and the polycrystal SiC substrate is eliminated, and the fabricating cost can be reduced by simplifying the fabricating process.

The second embodiment can provide the following effects (1) to (6).

(1) Since substrate bonding required for fabrication of composite substrates using a conventional ion implantation removing method is not used, it is possible to eliminate the yield deterioration due to bonding defects and voids caused by bonding. Moreover, man-hours are reduced, fixed and variable cost losses due to defects are reduced, and productivity and quality are improved.

(2) Precise polishing process for ensuring bondability is no longer required, and the high cost due to defective losses and increased processing costs is eliminated, thereby enabling the provision of the inexpensive SiC composite substrate.

(3) Since the interface contact resistance value can be reduced by performing ion implantation in advance into one side of the contact surface between the SiC polycrystalline growth layer and the SiC epitaxial growth layer, and by performing high-concentration doping control to another side during the film formation, the driving voltage peculiar to the composite substrate can be reduced.

(4) Since high-concentration autodoping can be performed for the thermal CVD method during deposition of the SiC polycrystalline growth layer, the electric resistance value of bulk can be reduced a resistance value equivalent to a single crystal substrate fabricated by the sublimation method.

(5) Of two ion implantations into the C plane of the SiC single crystal substrate, the first ion implantation is the hydrogen ion implantation for the ion implantation removing method, and after performing the ion implantation, the weakening thermal annealing is required to generate the hydrogen microbubbles to facilitate breaking the thinned layer. The second ion implantation is the phosphorus ion implantation for reduction of the contact interface resistance (ohmic contact) between the SiC single crystal substrate and the SiC polycrystalline growth layer, and after performing the implanting, the activation thermal annealing is required to activate the phosphorus ions and improve the donor concentration. Since both annealing processes are simultaneously realized by heating the substrate during the deposition of the SiC polycrystalline growth layer by the CVD, there is no need to perform these annealing processes separately, thereby reducing the fabricating cost.

(6) In the second embodiment in which the Si plane is thinned by the ion implantation removing method, since the SiC single crystal substrate itself is not necessary to insert into the CVD reaction chamber during the deposition of the SiC polycrystalline growth layer, the reuse times of the SiC single crystal substrate are increased, and thereby the cost can further be reduced.

The semiconductor substrate according to the embodiments can be applied to fabrication of, for example, various SiC-based semiconductor elements. The following describes examples of SiC Schottky Barrier Diodes (SiC-SBDs), SiC Trench-gate type Metal Oxide Semiconductor Field Effect Transistors (SiC-TMOSFETs), and SiC planar-gate type MOSFETs, as examples of the various SiC semiconductor elements.

(SiC-SBD)

Figure 12:
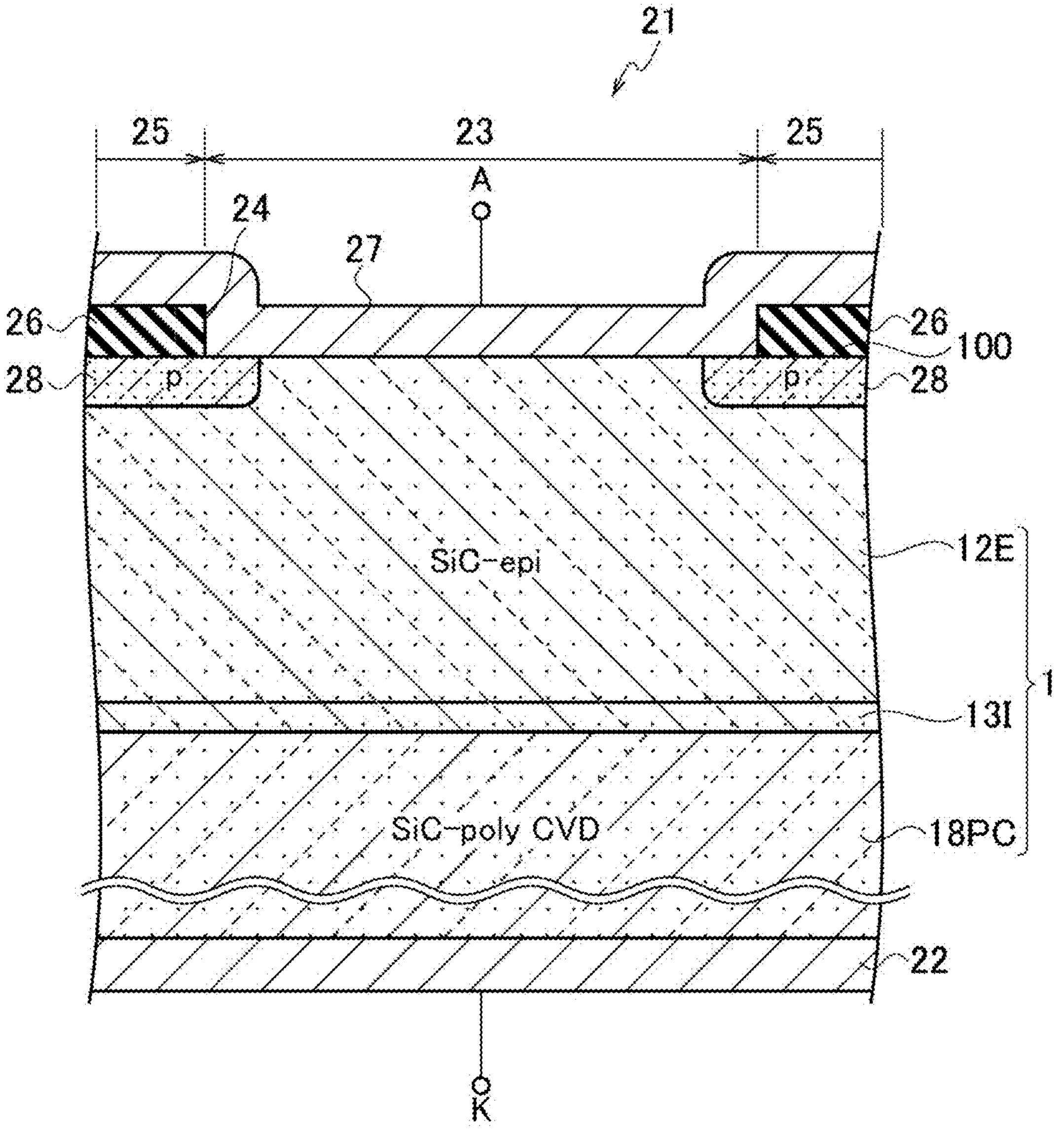
FIG. 12 illustrates a cross-sectional diagram illustrating a Schottky barrier diode fabricated using the semiconductor substrate according to the embodiments.

As a semiconductor device fabricated using the semiconductor substrate according to the embodiments, an SiC-SBD 21 includes a semiconductor substrate 1 including an SiC polycrystalline growth layer (CVD) 18PC and an SiC epitaxial growth layer 12E, as illustrated in FIG. 12. In addition, the SiC single crystal layer 13I may be interposed between the SiC polycrystalline growth layer 18PC and the SiC epitaxial growth layer 12E. In this case, the SiC single crystal layer 13I suppresses a depletion layer spreading in the SiC epitaxial growth layer 12E and also facilitates the ohmic contact with the SiC polycrystalline growth layer 18PC formed on the C plane of the SiC epitaxial growth layer 12E. The SiC epitaxial growth layer 12E is a drift layer, the SiC single crystal layer 13I is a buffer layer, and the SiC polycrystalline growth layer 18PC is a substrate layer.

The SiC polycrystalline growth layer 18PC is doped into an $n^+$ type (of which an impurity density is, for example, approximately $1\times10^{18}$ $cm^{-3}$ to approximately $1\times10^{21}$ $cm^{-3}$), and the SiC epitaxial growth layer 12E is doped into an $n^-$ type (of which an impurity density is, for example, approximately $5\times10^{14}$ $cm^{-3}$ to approximately $5\times10^{16}$ $cm^{-3}$). The SiC single crystal layer 13I is doped at higher concentration than that of the SiC epitaxial growth layer 12E.

Moreover, the SiC epitaxial growth layer 12E may contain one crystal structure selected from a group consisting of 4H—SiC, 6H—SiC, and 2H—SiC crystal structures.

As an n type doping impurity, for example, nitrogen (N), phosphorus (P), arsenic (As), or the like can be applied.

As a p type doping impurity, for example, boron (B), aluminum (Al), TMA, or the like can be applied.

A back side surface ((000-1) C plane) of the SiC polycrystalline growth layer 18PC includes a cathode electrode 22 so as to cover the whole region of the back side surface, and the cathode electrode 22 is connected to a cathode terminal K.

A front side surface 100 ((0001) Si plane) of the SiC epitaxial growth layer 12 includes a contact hole 24 to which a part of the SiC epitaxial growth layer 12E is exposed as an active region 23, and a field insulating film 26 is formed at a field region 25 which surrounding the active region 23.

Although the field insulating film 26 includes silicon oxide ($SiO_2$), the field insulating film 26 may include other insulating materials, e.g., silicon nitride (SiN). An anode electrode 27 is formed on the field insulating film 26, and the anode electrode 27 is connected to an anode terminal A.

Near the front side surface 100 (surface portion) of the SiC epitaxial growth layer 12, a p type Junction Termination Extension (JTE) structure 28 is formed so as to be contacted with the anode electrode 27. The JTE structure 28 is formed along an outline of the contact hole 24 so as to extend from the outside to inside of the contact hole 24 of the field insulating film 26.

(SiC-TMOSFET)

Figure 13:
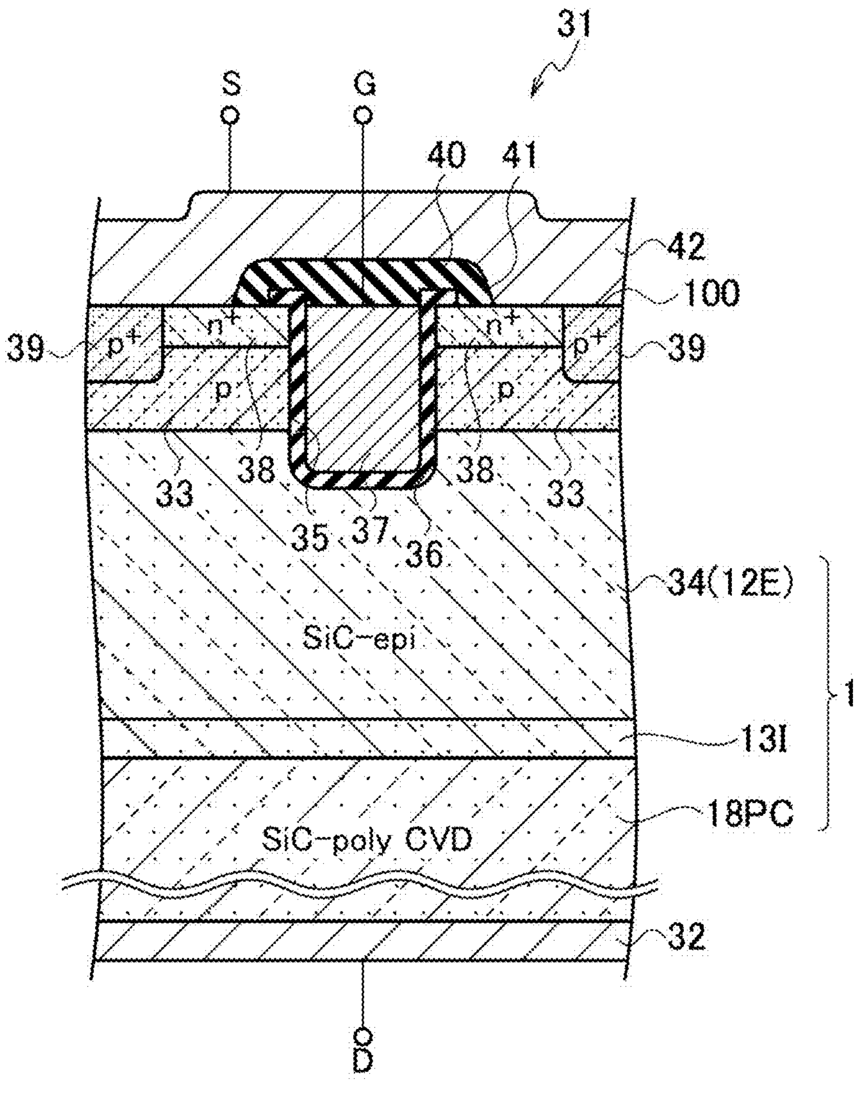
FIG. 13 illustrates a cross-sectional diagram illustrating a trench-gate type MOSFET fabricated using the semiconductor substrate according to the embodiments.

As a semiconductor device fabricated using the semiconductor substrate according to the embodiments, a trench-gate type MOSFET 31 includes a semiconductor substrate 1 including an SiC polycrystalline growth layer 18PC and an SiC epitaxial growth layer 12E, as illustrated in FIG. 13. In addition, the SiC single crystal layer 13I may be interposed between the SiC polycrystalline growth layer 18PC and the SiC epitaxial growth layer 12E. In this case, the SiC single crystal layer 13I suppresses a depletion layer spreading in the SiC epitaxial growth layer 12E and also facilitates the ohmic contact with the SiC polycrystalline growth layer 18PC formed on the C plane of the SiC epitaxial growth layer 12E. The SiC epitaxial growth layer 12E is a drift layer, the SiC single crystal layer 13I is a buffer layer, and the SiC polycrystalline growth layer 18PC is a substrate layer.

The SiC polycrystalline growth layer 18PC is doped into an $n^+$ type (of which an impurity density is, for example, approximately $1\times10^{18}$ $cm^{-3}$ to approximately $1\times10^{21}$ $cm^{-3}$), and the SiC epitaxial growth layer 12E is doped into an $n^-$ type (of which an impurity density is, for example, approximately $5\times10^{14}$ $cm^{-3}$ to approximately $5\times10^{16}$ $cm^{-3}$). The SiC single crystal layer 13I is doped at higher concentration than that of the SiC epitaxial growth layer 12E.

Moreover, the SiC epitaxial growth layer 12E may contain one crystal structure selected from a group consisting of 4H—SiC, 6H—SiC, and 2H—SiC crystal structures.

As an n type doping impurity, for example, nitrogen (N), phosphorus (P), arsenic (As), or the like can be applied.

As a p type doping impurity, for example, boron (B), aluminum (Al), TMA, or the like can be applied.

A back side surface ((000-1) C plane) of the SiC polycrystalline growth layer 18PC includes a drain electrode 32 so as to cover the whole region of the back side surface, and the drain electrode 32 is connected to a drain terminal D.

Near the front side surface 100 ((0001) Si plane) (surface portion) of the SiC epitaxial growth layer 12E, a p type body region 33 (of which an impurity concentration is, for example, approximately $1\times10^{16}$ $cm^3$ to approximately $1\times10^{19}$ $cm^{-3}$) is formed. In the SiC epitaxial growth layer 12E, a portion at a side of the SiC polycrystalline growth layer 18PC with respect to the body region 33 is an $n^-$ type drain region 34 (12E) where a state of the SiC epitaxial growth layer RE is still kept.

A gate trench 35 is formed in the SiC epitaxial growth layer 12E. The gate trench 35 passes through the body region 33 from the surface 100 of the SiC epitaxial growth layer 12E, and a deepest portion of the gate trench 35 extends to the drain region 34 (12E).

A gate insulating film 36 is formed on an inner surface of the gate trench 35 and the surface 100 of the SiC epitaxial growth layer 12E so as to cover the whole of the inner surface of the gate trench 35. Moreover, a gate electrode 37 is embedded in the gate trench 35 by filling up the inside of the gate insulating film 36 with, for example, polysilicon. A gate terminal G is connected to the gate electrode 37.

An $n^+$ type source region 38 forming a part of a side surface of the gate trench 35 is formed on a surface portion of the body region 33.

Moreover, a $p^+$ type body contact region 39 (of which an impurity concentration is, for example, approximately $1\times10^{18}$ $cm^{-3}$ to approximately $1\times10^{21}$ $cm^{-3}$) which passes through the source region 38 from the surface 100 and is connected to the body region 33 is formed on the SiC epitaxial growth layer 12.

An interlayer insulating film 40 including $SiO_2$ is formed on the SiC epitaxial growth layer 12E. A source electrode 42 is connected to the source region 38 and the body contact region 39 through a contact hole 41 formed in the interlayer insulating film 40. A source terminal S is connected to the source electrode 42.

A predetermined voltage (voltage equal to or greater than a gate threshold voltage) is applied to the gate electrode 37 in a state where a predetermined potential difference is generated between the source electrode 42 and the drain electrode 32 (between the source and the drain). Thereby, a channel can be formed by an electric field from the gate electrode 37 near the interface between the gate insulating film 36 and the body region 33. Thus, an electric current can be flowed between the source electrode 42 and the drain electrode 32, and thereby SiC-TMOSFET 31 can be turned ON state.

(SiC Planar-Gate Type MOSFET)

Figure 14:
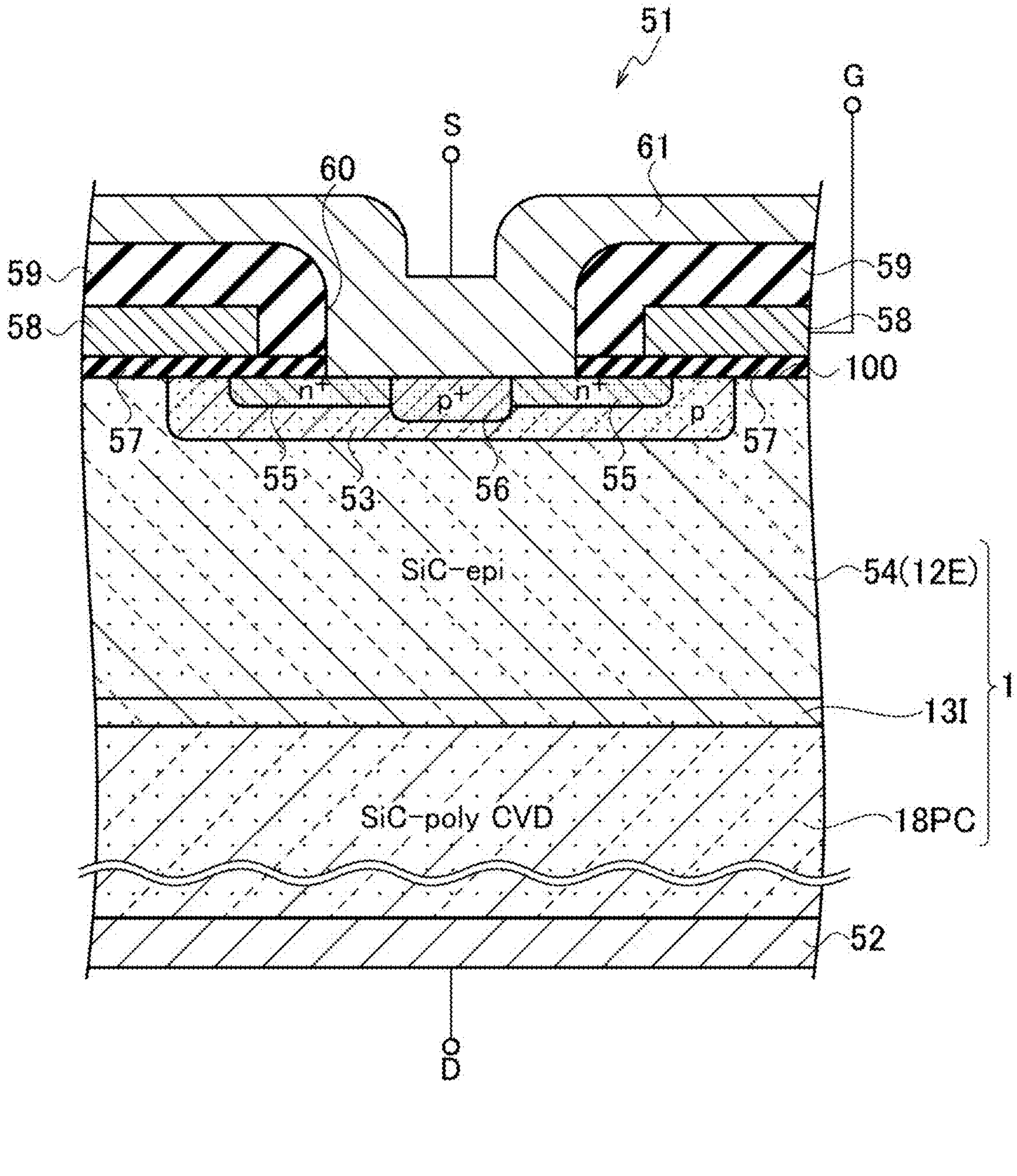
FIG. 14 illustrates a cross-sectional diagram illustrating a planar-gate type MOSFET fabricated using the semiconductor substrate according to the embodiments.

As a semiconductor device fabricated using the semiconductor substrate 1 according to the embodiments, a planar-gate type MOSFET 51 includes a semiconductor substrate 1 including an SiC polycrystalline growth layer 18PC and an SiC epitaxial growth layer 12E, as illustrated in FIG. 14. In addition, the SiC single crystal layer 13I may be interposed between the SiC polycrystalline growth layer 18PC and the SiC epitaxial growth layer 12E. In this case, the SiC single crystal layer 13I suppresses a depletion layer spreading in the SiC epitaxial growth layer 12E and also facilitates the ohmic contact with the SiC polycrystalline growth layer 18PC formed on the C plane of the SiC epitaxial growth layer 12E. The SiC epitaxial growth layer 12E is a drift layer, the SiC single crystal layer 13I is a buffer layer, and the SiC polycrystalline growth layer 18PC is a substrate layer.

The SiC polycrystalline growth layer 18PC is doped into an $n^+$ type (of which an impurity density is, for example, approximately $1\times10^{18}$ $cm^{-3}$ to approximately $1\times10^{21}$ $cm^{-3}$), and The SiC epitaxial growth layer 12 is doped into an $n^-$ type (of which an impurity density is, for example, approximately $5\times10^{14}$ $cm^{-3}$ to approximately $5\times10^{16}$ $cm^{-3}$).

Moreover, the SiC epitaxial growth layer 12 may contain one crystal structure selected from a group consisting of 4H—SiC, 6H—SiC, and 2H—SiC crystal structures.

As an n type doping impurity, for example, nitrogen (N), phosphorus (P), arsenic (As), or the like can be applied.

As a p type doping impurity, for example, boron (B), aluminum (Al), TMA, or the like can be applied.

A back side surface ((000-1) C plane) of the SiC single crystal substrate 10SB includes a drain electrode 52 so as to cover the whole region of the back side surface, and the drain electrode 52 is connected to a drain terminal D.

Near the front side surface 100 ((0001) Si plane) (surface portion) of the SiC epitaxial growth layer 12E, a p type body region 53 (of which an impurity concentration is, for example, approximately $1\times10^{16}$ $cm^{-3}$ to approximately $1\times10^{19}$ $cm^{-3}$) is formed in a well shape. In the SiC epitaxial growth layer 12E, a portion at a side of the SiC single crystal substrate 10SB with respect to the body region 53 is an $n^-$ type drain region 54 (12E) where a state after the epitaxial growth is still kept.

An $n^+$ type source region 55 is formed on a surface portion of the body region 53 with a certain space from a periphery of the body region 53.

A $p^+$ type body contact region 56 (of which an impurity concentration is, for example, approximately $1\times10^{18}$ $cm^{-3}$ to approximately $1\times10^{21}$ $cm^{-3}$) is formed inside of the source region 55. The body contact region 56 passes through the source region 55 in a depth direction, and is connected to the body region 53.

A gate insulating film 57 is formed on the front side surface 100 of the SiC epitaxial growth layer 12E. The gate insulating film 57 covers the portion surrounding the source region 55 in the body region 53 (peripheral portion of the body region 53), and an outer peripheral portion of the source region 55.

A gate electrode 58 including polysilicon, for example, is formed on the gate insulating film 57. The gate electrode 58 is opposed to the peripheral portion of the body region 53 so as to sandwich the gate insulating film 57. A gate terminal G is connected to the gate electrode 58.

An interlayer insulating film 59 including $SiO_2$ is formed on the SiC epitaxial growth layer 12E. A source electrode 61 is connected to the source region 55 and the body contact region 56 through a contact hole 60 formed in the interlayer insulating film 59. A source terminal S is connected to the source electrode 61.

A predetermined voltage (voltage equal to or greater than a gate threshold voltage) is applied to the gate electrode 58 in a state where a predetermined potential difference is generated between the source electrode 61 and the drain electrode 52 (between the source and the drain). Thereby, a channel can be formed by an electric field from the gate electrode 58 near the interface between the gate insulating film 57 and the body region 53. Thus, an electric current can be flowed between the source electrode 61 and the drain electrode 52, and thereby the planar-gate type MOSFET 51 can be turned ON state.

Although the embodiments have been explained above, the embodiment can also be implemented with other configurations.

For example, although illustration is omitted, an MOS capacitor can also be fabricated using the semiconductor substrate 1 according to the embodiments. According to such MOS capacitors, a yield and reliability can be improved.

Moreover, although illustration is omitted, bipolar junction transistors can also be fabricated using the semiconductor substrate 1 according to the embodiments. In addition, the semiconductor substrate 1 according to the embodiments can also be used for fabrication of SiC pn diodes, SiC IGBTs, SiC complementary MOSFETs, and the like. Moreover, the semiconductor substrate 1 according to the embodiments can also be applied to other type devices such as Light Emitting Diodes (LEDs) and Semiconductor Optical Amplifiers (SOAs), for example.

(Crystal Plane)

Figure 15A:
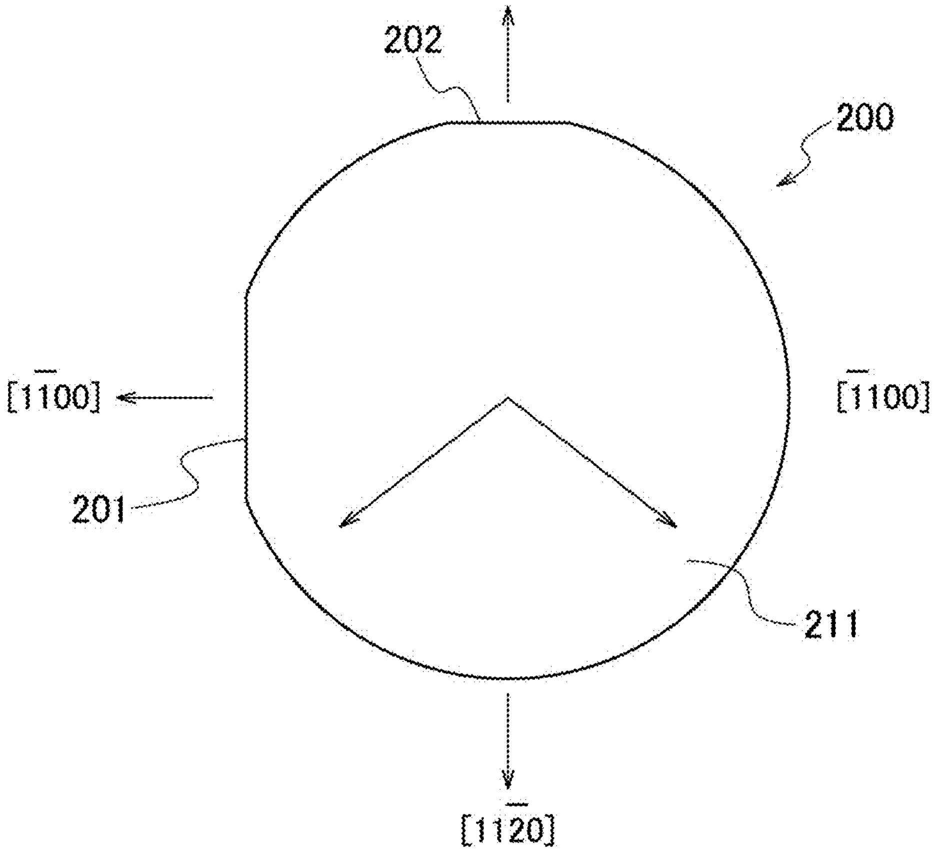
FIG. 15A illustrates a top view diagram for explaining a crystal plane of SiC.
Figure 15B:
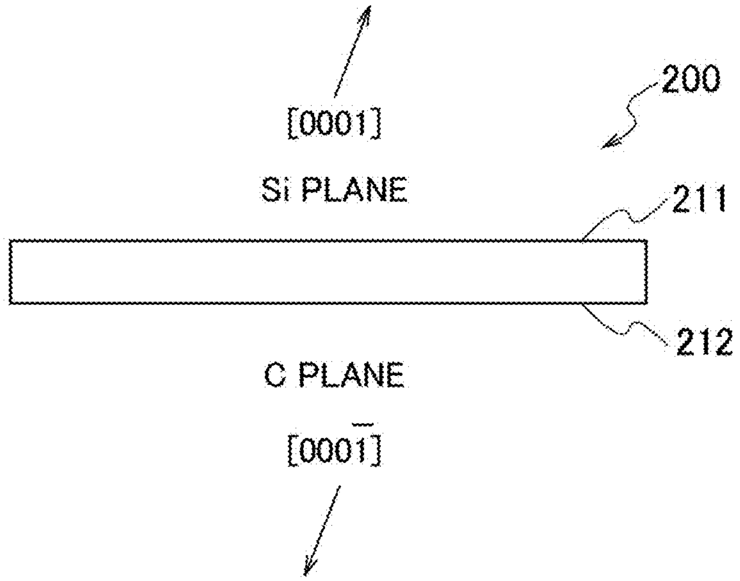
FIG. 15B illustrates a side view diagram for explaining the crystal plane of SiC.

FIGS. 15A and 15B are diagrams for explaining a crystal plane of SiC. FIG. 15A is a top view diagram illustrating an Si plane 211 of an SiC wafer 200 on which a primary orientation flat 201 and a secondary orientation flat 202 are formed. In the side view diagram observed from the orientation of [−1100] illustrated in FIG. 15B, an Si plane 211 of the orientation of [0001] is formed on an upper surface, and a C plane 212 of an orientation of [000-1] is formed on a lower surface.

Figure 16:
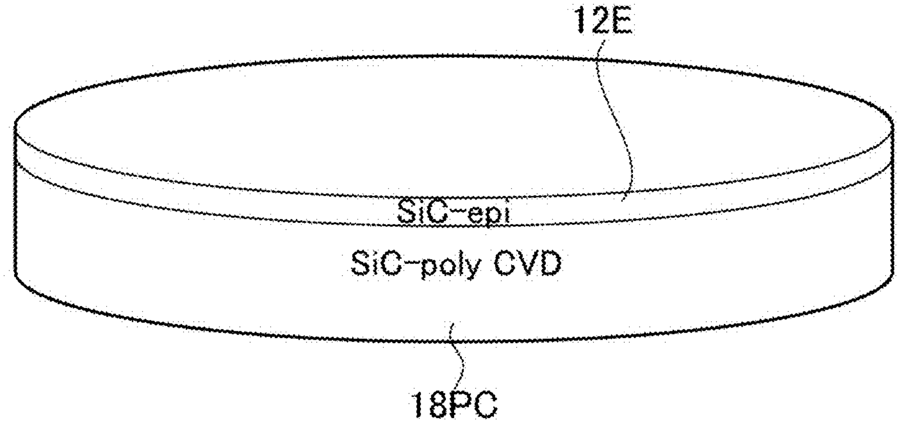
FIG. 16 illustrates a bird's-eye view of a semiconductor substrate (wafer) according to the embodiments.

A schematic bird's-eye view configuration of the semiconductor substrate (wafer) 1 according to the embodiments includes an SiC polycrystalline growth layer 18PC and an SiC epitaxial growth layer 12E, as illustrated in FIG. 16.

A thickness of the SiC polycrystalline growth layer 18PC is, for example, approximately 200 μm to approximately 500 μm, and a thickness of the SiC epitaxial growth layer 12E is, for example, approximately 4 μm to approximately 100 μm.

(Example of Crystal Structure)

Figure 17A:
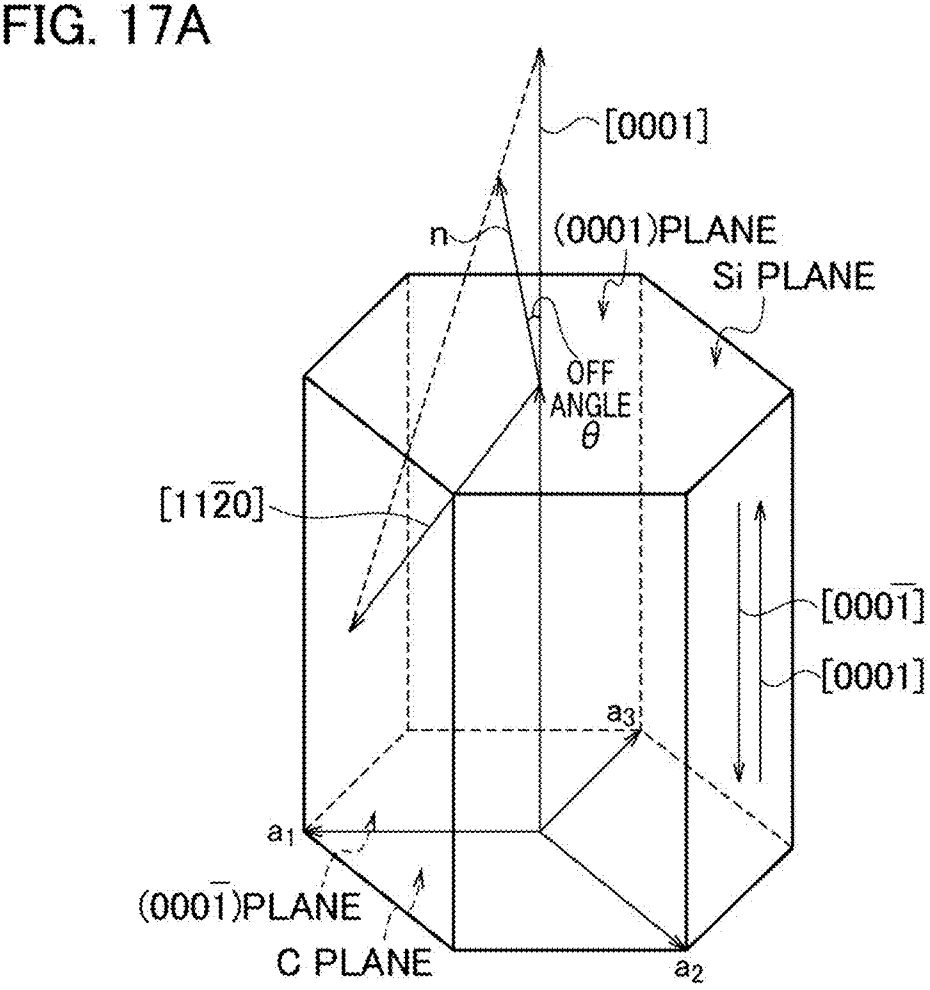
FIG. 17A illustrates a bird's-eye view of a unit cell of a 4H—SiC crystal applicable to the SiC epitaxial substrate of the semiconductor substrate according to the embodiments.
Figure 17B:
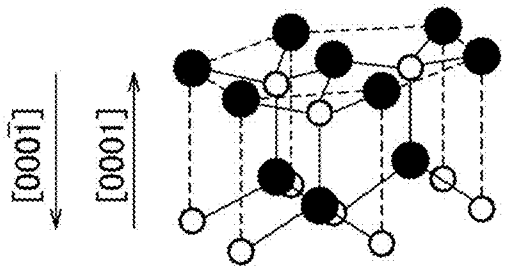
FIG. 17B illustrates a configuration diagram of a two-layer portion of the 4H—SiC crystal.
Figure 17C:
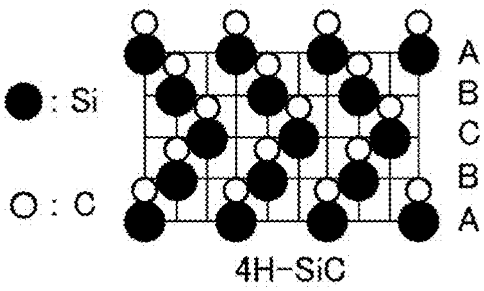
FIG. 17C illustrates a configuration diagram of a four-layer portion of the 4H—SiC crystal.

FIG. 17A illustrates a schematic bird's-eye view configuration of a unit cell of a 4H—SiC crystal applicable to the SiC epitaxial growth layer 12E, FIG. 17B shows a schematic configuration of a two layer portion of the 4H—SiC crystal, and FIG. 17C shows a schematic configuration of four layer portion of the 4H—SiC crystal.

Figure 18:
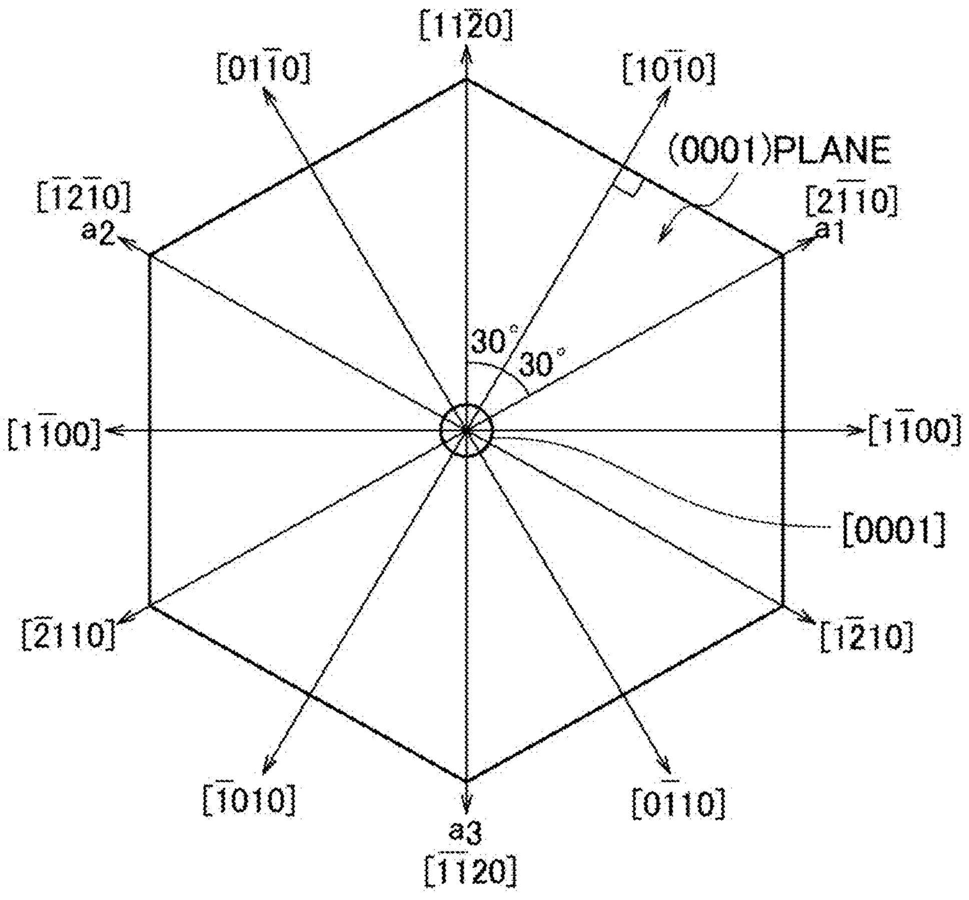
FIG. 18 illustrates a configuration diagram showing the unit cell of the 4H—SiC crystal shown in FIG. 17A observed from directly above a (0001) surface.

Moreover, FIG. 18 illustrates a schematic configuration of the unit cell of the 4H—SiC crystal structure of shown in FIG. 17A observed from directly above a (0001) surface.

As illustrated in FIGS. 17A to 17C, the crystal structure of the 4H—SiC can be approximated with a hexagonal system, and four C atoms are bound with respect to one Si atom. The four C atoms are positioned at four vertexes of a regular tetrahedron in which the Si atom is disposed at a center thereof. In the four C atoms, one Si atom is positioned in [0001] axial direction with respect to the C atom, and other three C atoms are positioned at a [000-1] axis side with respect to the Si atom. In FIG. 17A, an off angle θ is equal to or less than approximately 4 degrees.

The [0001] axis and [000-1] axis are along the axial direction of the hexagonal prism, and a plane (top plane of the hexagonal prism) using the [0001] axis as a normal line is (0001) plane (Si plane). On the other hand, a surface (bottom surface of the hexagonal prism) using the [000-1] axis as a normal line is (000-1) surface (C surface).

Moreover, directions vertical to the [0001] axis, and passing along the vertexes not adjacent with one another in the hexagonal prism observed from directly above the (0001) plane are respectively a1 axis [2-1-10], a2 axis [−12-10], and a3 axis [−1-120].

As shown in FIG. 18, a direction passing through the vertex between the a1 axis and the a2 axis is [11-20] axis, a direction passing through the vertex between the a2 axis and the a3 axis is [−2110] axis, and a direction passing through the vertex between the a3 axis and the a1 axis is [1-210] axis.

The axes which are incline at an angle of 30 degrees with respect to each axis of the both sides, and used as the normal line of each side surface of the hexagonal prism, between each of the axes of the above-mentioned six axes passing through the respective vertexes of the hexagonal prism, are respectively [10-10] axis, [1-100] axis, [0-110] axis, [−1010] axis, [-10] axis, and [01-10] axis, in the clockwise direction sequentially from between the a1 axis and the [11-20] axes. Each plane (side plane of the hexagonal prism) using these axes as the normal line is a crystal surface right-angled to the (0001) plane and the (000-1) plane.

The epitaxial growth layer 12E may include at least one type or a plurality of types semiconductor(s) selected from a group consisting of group IV semiconductors, group III-V compound semiconductors, and group II-VI compound semiconductors.

Moreover, the SiC single crystal substrate 10SB and the SiC epitaxial growth layer 12E may contain any one material selected from a group consisting of 4H—SiC, 6H—SiC, and 2H—SiC materials.

In addition, the SiC single crystal substrate 10SB and the SiC epitaxial growth layer 12E may contain at least one type selected from a group consisting of GaN, BN, AlN, $Al_2O_3$, $Ga_2O_3$, diamond, carbon, and graphite, as other materials except for SiC.

The semiconductor device including the semiconductor substrate according to the embodiments may include any one of GaN-based, AlN-based, and gallium-oxide-based IGBTs, diodes, MOSFETs, and thyristors, except for SiC-based devices.

The semiconductor device including the semiconductor substrate according to the embodiments may include a configuration of any one of a 1-in-1 module, a 2-in-1 module, a 4-in-1 module, a 6-in-1 module, a 7-in-1 module, an 8-in-1 module, a 12-in-1 module, or a 14-in-1 module.

In accordance with the semiconductor substrate according to the embodiments, it is possible to use, for example, a low cost SiC polycrystalline substrate, instead of a high cost SiC single crystalline substrate, as a substrate material.

Other Embodiments

As explained above, the embodiments have been described, as a disclosure including associated description and drawings to be construed as illustrative, not restrictive. It will be apparent to those skilled in the art from the disclosure that various alternative embodiments, examples and implementations can be made.

Such being the case, the embodiments cover a variety of embodiments and the like, whether described or not.

INDUSTRIAL APPLICABILITY

The semiconductor substrate of the present embodiments and the power semiconductor device including such a semiconductor substrate can be used for semiconductor module techniques, e.g., IGBT modules, diode modules, MOS modules (SiC, GaN, AlN, Gallium oxide), and the like; and can be applied to a wide range of application fields such as power modules for inverter circuits that drive electric motors used as power sources for electric vehicles (including hybrid vehicles), trains, industrial robots and the like or power modules for inverter circuits that convert electric power generated by other power generators (particularly, private power generators) such as solar cells and wind power generators into electric power of a commercial power source.

What is claimed is:

1. A semiconductor substrate comprising:

a hexagonal SiC single crystal layer;

an SiC epitaxial growth layer disposed on an Si plane of the SiC single crystal layer; and an SiC polycrystalline growth layer disposed on a C plane opposite to the Si plane of the SiC single crystal layer, wherein the SiC single crystal layer comprises a single crystal SiC thin layer, the single crystal SiC thin layer comprises a first ion implantation layer, the SiC single crystal layer comprises a second ion implantation layer, and the second ion implantation layer is disposed between the first ion implantation layer and the SiC polycrystalline growth layer.

2. The semiconductor substrate according to claim 1, wherein the first ion implantation layer comprises a hydrogen ion implantation layer.

3. The semiconductor substrate according to claim 2, wherein the single crystal SiC thin layer comprises a weakened layer of the hydrogen ion implantation layer.

4. The semiconductor substrate according to claim 1, wherein the second ion implantation layer comprises a phosphorus ion implantation layer.

5. The semiconductor substrate according to claim 1, wherein the Si plane of the SiC single crystal layer is a [0001] oriented plane of 4H-SiC, and a C plane opposite to the Si plane of the SiC single crystal layer is a [000-1] oriented plane of 4H-SiC.

6. The semiconductor substrate according to claim 1, wherein the SiC single crystal layer can be reused by being removed from the epitaxial growth layer.

7. A semiconductor device comprising the semiconductor substrate according to claim 1.

8. The semiconductor device according to claim 7, wherein the semiconductor device comprises at least one or a plurality of transistors selected from the group consisting of an SiC Schottky barrier diode, an SiC-MOSFET, an SiC bipolar junction transistor, an SiC diode, an SiC thyristor, and an SiC insulated gate bipolar transistor.

* * * * *